US009176553B2

(12) United States Patent
Kajigaya et al.

(10) Patent No.: US 9,176,553 B2
(45) Date of Patent: Nov. 3, 2015

(54) SEMICONDUCTOR DEVICE EMPLOYING DVFS FUNCTION

(71) Applicant: PS4 LUXCO S.A.R.L., Luxembourg (LU)

(72) Inventors: Kazuhiko Kajigaya, Tokyo (JP); Takamasa Suzuki, Tokyo (JP)

(73) Assignee: PS4 Luxco S.a.r.l., Luxembourg (LU)

( * ) Notice: Subject to any disclaimer, the term of this patent is extended or adjusted under 35 U.S.C. 154(b) by 119 days.

(21) Appl. No.: 13/942,141

(22) Filed: Jul. 15, 2013

(65) Prior Publication Data

US 2014/0032941 A1 Jan. 30, 2014

(30) Foreign Application Priority Data

Jul. 24, 2012 (JP) .................................. 2012-163885

(51) Int. Cl.
*G11C 7/00* (2006.01)
*G06F 1/26* (2006.01)
*G06F 1/32* (2006.01)

(52) U.S. Cl.
CPC ................ *G06F 1/26* (2013.01); *G06F 1/3275* (2013.01); *Y02B 60/1225* (2013.01); *Y02B 60/1228* (2013.01)

(58) Field of Classification Search
CPC ....... G11C 5/147; G11C 5/14; G11C 11/4074
USPC ..................... 365/227, 189.09, 226
See application file for complete search history.

(56) References Cited

U.S. PATENT DOCUMENTS 7,974,140 B2 * 7/2011 Ogasawara .............. 365/189.09
8,284,619 B2 * 10/2012 Nakakubo ................ 365/189.09
2011/0083021 A1 4/2011 Floyd et al.

FOREIGN PATENT DOCUMENTS

JP 2011-081800 A 4/2011

* cited by examiner

*Primary Examiner* — Son Dinh

(57) ABSTRACT

Disclosed herein is a device that includes: a memory cell array including a plurality of memory cells, the memory cell array operates on a first internal voltage; a peripheral circuit accessing selected one or ones of the memory cells, the peripheral circuit operates on a second internal voltage; a first internal voltage generation circuit that supplies the first internal voltage to the memory cell array; and a second internal voltage generation circuit that supplies the second internal voltage to the peripheral circuit. The second internal voltage generation circuit sets the second internal voltage to a first voltage value in a first mode, and to a second voltage value that is different from the first voltage value in a second mode. The first internal voltage generation circuit sets the first internal voltage to a third voltage value in both the first and second modes.

19 Claims, 17 Drawing Sheets

SEMICONDUCTOR DEVICE EMPLOYING DVFS FUNCTION

BACKGROUND OF THE INVENTION

1. Field of the Invention

The present invention relates to a semiconductor device and an information processing system including the semiconductor device, and particularly to a semiconductor device that can dynamically changes an operating frequency and an operating voltage, and an information processing system including the semiconductor device.

2. Description of Related Art

In recent years, a DVFS (Dynamic Voltage Frequency Scaling) function has been often used in logic-based semiconductor devices such as system LSIs (Large-Scale Integration) used for mobile devices and the like and MPUs (Micro-Processing Unit) used for personal computers and server computers so as to achieve a high performance and a low power consumption. The semiconductor devices equipped with the DVFS function can dynamically change an operating frequency and operating voltage of circuit blocks included therein depending on processing power requirements of the circuit blocks (See Japanese Patent Application Laid-Open No. 2011-81800). If the logic-based semiconductor devices are equipped with the DVFS function, it is possible to obtain a high performance during a high load operation, as well as to dramatically reduce current consumption during a low load operation.

However, in semiconductor memory devices such as DRAM (Dynamic Random Access Memory), part of a memory cell array may perform an analog operation that is not in synchronization with a clock signal. Therefore, if the semiconductor memory devices employ the DVFS function, the memory cell array may not work properly. As one example, in the case of DRAM, if the DVFS function is used to change a selection voltage of a word line or an array voltage that is written into a cell capacitor, the problem arises that an operating margin of the memory cell array significantly decreases.

SUMMARY

In one embodiment, there is provided a semiconductor device that includes: a memory cell array including a plurality of memory cells, the memory cell array operates on a first internal voltage; a peripheral circuit accessing selected one or ones of the memory cells, the peripheral circuit operates on a second internal voltage; a first internal voltage generation circuit that supplies the first internal voltage to the memory cell array; and a second internal voltage generation circuit that supplies the second internal voltage to the peripheral circuit. The second internal voltage generation circuit sets the second internal voltage to a first voltage value in a first mode, and to a second voltage value that is different from the first voltage value in a second mode. The first internal voltage generation circuit sets the first internal voltage to a third voltage value in both the first and second modes.

In another embodiment, there is provided a semiconductor device that includes: a plurality of input terminals; a command decoder coupled to ones of the input terminals and configured to generate a mode register set signal in response to signals supplied with the ones of the input terminals; a mode register coupled to the command decoder, the mode register being configured to store mode data in response to the mode register set signal; and an internal voltage generation circuit configured to generate an internal voltage and determine a level of the internal voltage in response to the mode data.

In still another embodiment, there is provided an information processing system that includes: a semiconductor device and a processor that brings the semiconductor device into one of first and second modes. The semiconductor device includes: a memory cell array including a plurality of memory cells, the memory cell array operates on a first internal voltage; a peripheral circuit accessing selected one or ones of the memory cells, the peripheral circuit operates on a second internal voltage; a first internal voltage generation circuit that supplies the first internal voltage to the memory cell array; and a second internal voltage generation circuit that supplies the second internal voltage to the peripheral circuit. The second internal voltage generation circuit sets the second internal voltage to a first voltage value in the first mode, and to a second voltage value that is different from the first voltage value in the second mode. The first internal voltage generation circuit sets the first internal voltage to a third voltage value in both the first and second modes.

According to one embodiment of the present invention, even if the operating voltage of a peripheral circuit portion is switched by the DVFS function, the operating voltage of the memory cell array is kept constant. Therefore, the memory cell array works properly. As a result, it is possible to provide a memory-based semiconductor device that can achieve a high performance at the time of a high load and significantly reduce current consumption at the time of a low load, and an information processing system that includes the memory-based semiconductor device.

DETAILED DESCRIPTION OF THE EMBODIMENTS

Preferred embodiments of the present invention will be explained below in detail with reference to the accompanying drawings.

Figure 1:
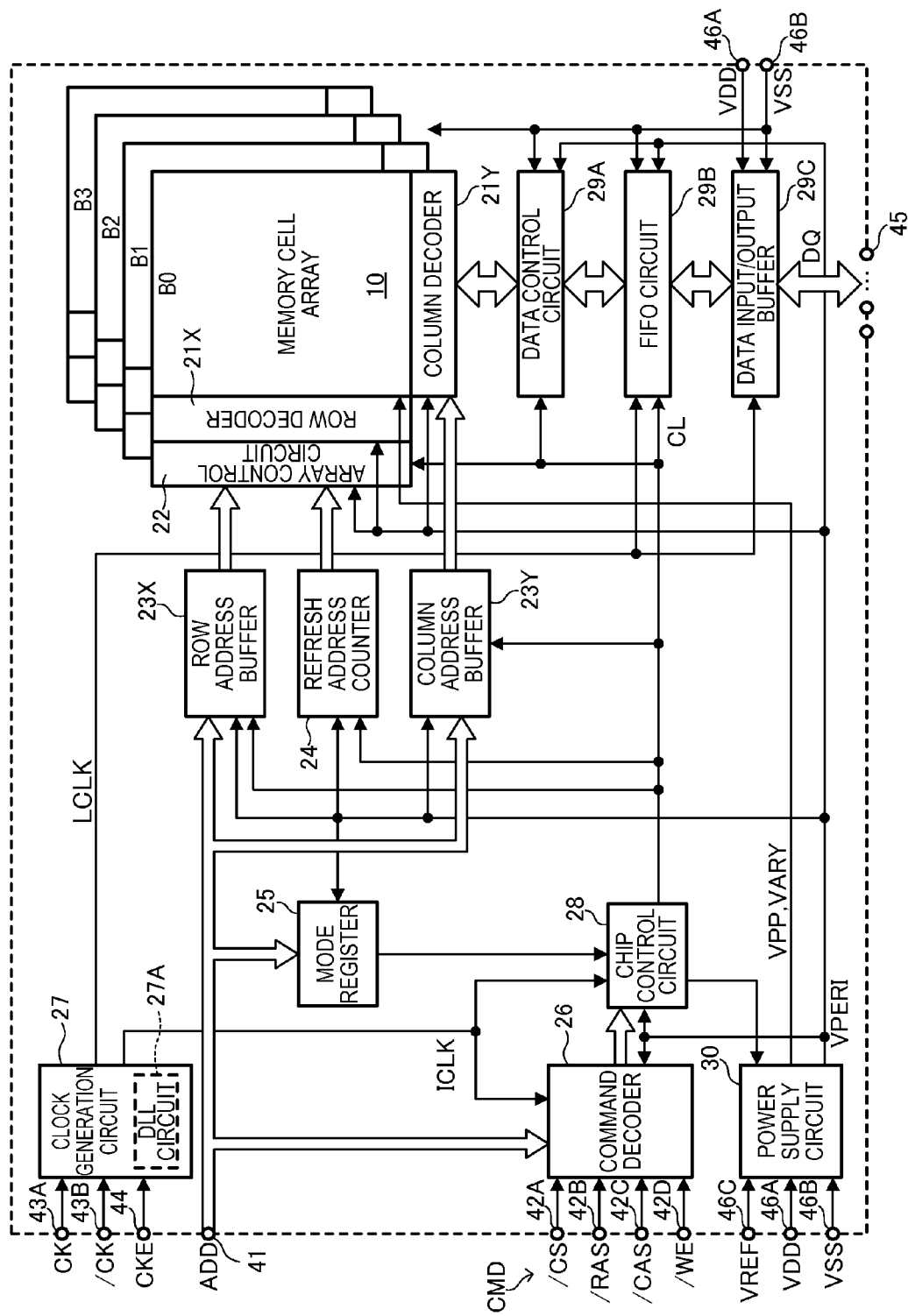
FIG. 1 is a block diagram showing the configuration of a semiconductor device according to an embodiment of the present invention.

Referring now to FIG. 1, the semiconductor device of the present embodiment is DRAM, and is integrated on a single semiconductor chip made of silicon or the like. However, the present invention is not limited to the above structure. The present invention may be a stacked semiconductor device in which a plurality of semiconductor chips are stacked. The semiconductor device of the present invention is not limited to DRAM. The semiconductor device of the present invention may be other types of volatile semiconductor memory devices such as SRAM, or nonvolatile semiconductor memory devices such as flash memories, MRAM, ReRAM, and PCRAM, or composite-type semiconductor devices that include memory cell arrays in logic-based semiconductor devices.

The semiconductor device of the present embodiment includes memory cell arrays 10 including a plurality of memory cells, a peripheral circuit portion 20 that selecting a memory cell, inputs data into the selected memory cell and outputs data from the selected memory cell. The semiconductor device further includes a power supply circuit 30 supplying an operating voltage to the memory cell arrays 10 and the peripheral circuit portion 20, and a plurality of external terminals 40.

Although not specifically limited, the semiconductor device of the present embodiment includes four banks B0 to B3. The memory cell arrays 10 are provided for each of the banks B0 to B3. The detailed configuration of the memory cell arrays 10 will be described later. The peripheral circuit portion 20 includes circuit blocks that are provided for each of the banks B0 to B3 and circuit blocks that are shared by the banks B0 to B3. The circuit blocks that are provided for each of the banks B0 to B3 include row decoders 21X, column decoders 21Y, and array control circuits 22. The circuit blocks that are shared by the banks B0 to B3 include a row address buffer 23X, a column address buffer 23Y, a refresh address counter 24, a mode register 25, a command decoder 26, a clock generation circuit 27, a chip control circuit 28, a data control circuit 29A, a FIFO circuit 29B, and a data input/output buffer 29C. The above components will be detailed later. The memory cell arrays 10 and the peripheral circuit portion 20 operate on a predetermined internal voltage that is generated by the power supply circuit 30.

The external terminals 40 include an address terminals 41, command terminals 42A to 42D, clock terminals 43A and 43B, a clock enable terminal 44, data terminals 45, and power-supply terminals 46A to 46C.

The address terminals 41 are supplied with an address signal ADD from outside. The address signal ADD is supplied to the row address buffer 23X, the column address buffer 23Y, and the mode register 25. More specifically, when a command signal CMD indicates row access, the address signal ADD is supplied to the row address buffer 23X. When the command signal CMD indicates column access, the address signal ADD is supplied to the column address buffer 23Y. When the command signal CMD indicates a mode register set, the address signal ADD is supplied to the mode register 25.

The address signal ADD that is input into the row address buffer 23X is supplied to the row decoder 21X and the array control circuit 22. The row decoder 21X selects a word line included in the memory cell arrays 10 based on the address signal ADD. The array control circuit 22 selects a sense amplifier included in the memory cell arrays 10 based on the address signal ADD. Accordingly, when the address signal ADD is supplied to the row decoder 21X and the array control circuit 22, a predetermined word line included in selected one of the banks B0 to B3 is activated, and then a predetermined sense amplifier is activated. As a result, row access to a memory cell specified by the address signal ADD is carried out.

The address signal ADD that is input into the column address buffer 23Y is supplied to the column decoders 21Y. The column decoder 21Y selects a bit line included in the memory cell arrays 10. Accordingly, when the address signal ADD is supplied to the column decoder 21Y, a predetermined bit line included in selected one of the banks B0 to B3 is selected. As a result, column access to a memory cell specified by the address signal ADD is carried out.

The mode register 25 specifies an operation mode of the semiconductor device. The semiconductor device of the present embodiment employs a DVFS function, and the mode register 25 enables the semiconductor device to be set to a standard mode, a low power consumption mode, or a high-speed operation mode. The above operation modes will be detailed later.

The command terminals 42A to 42D include a chip select terminal 42A supplied with a chip select signal /CS, row address strobe terminal 42B supplied with a row address strobe signal /RAS, column address strobe terminal 42C supplied with a column address strobe signal /CAS, and write enable terminal 42D supplied with write enable signal /WE. The types of command signals CMD are defined by a combination of the signals /CS, /RAS, /CAS, and /WE and a clock enable signal CKE, which will be described later. The types of command signals CMD include an active command which is issued to perform row access, a read command and write command which are issued to perform column access, an auto-refresh command which is issued to perform a refresh operation, a self-refresh command which is issued to enter a self-refresh mode, a power-down command which is issued to enter a power-down mode, and a mode register set command which is issued to perform mode-register setting operation.

When an active command is issued, the above-described operation is carried out. An address signal ADD that is input via the address terminal 41 is supplied to the row address buffer 23X. As a result, a row access is carried out to a memory cell specified by the address signal ADD.

When a read command is issued, an address signal ADD that is input via the address terminal 41 is supplied to the column address buffer 23Y. As a result, a column access is carried out to a memory cell specified by the address signal ADD. Read data that is read from the specified memory cell is output to data terminals 45 via the data control circuit 29A, the FIFO circuit 29B, and the data input/output buffer 29C. In this case, the operation of the FIFO circuit 29B and data input/output buffer 29C is performed in synchronization with an internal clock signal LCLK. The period from when the read command is issued until when the read data starts to be output is called CAS latency (CL), which is defined by the number of clock cycles of the external clock signals CK and /CK. However, the read command may be issued prior to an original issuing timing with a time period equal to an additive latency (AL). In this case, the period from when the read command is actually issued until when the read data starts to be output is defined as CL+AL. The values of CL and AL are set in the mode register 25.

When a write command is issued, an address signal ADD that is input via the address terminal 41 is also supplied to the column address buffer 23Y. As a result, a column access is also carried out to a memory cell specified by the address signal ADD. Write data that is input into the data terminals 45 is written into a specified memory cell via the data input/output buffer 29C, the FIFO circuit 29B, and the data control circuit 29A. The period from when the write command is issued until when the write data starts to be input is called CAS write latency (CWL), which is defined by the number of clock cycles of the external clock signals CK and /CK. However, the write command may be issued prior to an original issuing timing with a time period equal to the additive latency (AL). In this case, the period from when the write command is actually issued until when the write data starts to be input is defined as CWL+AL. The value of CWL is set in the mode register 25.

When an auto-refresh command is issued, a row address that is set in the refresh address counter 24 is supplied to the row decoders 21X and the array control circuits 22. Moreover, the set row address is incremented or decremented. As a result, a refresh operation is carried out on a memory cell indicated by the row address that is set in the refresh address counter 24.

When a self-refresh command is issued, the semiconductor device enters a self-refresh mode. After the semiconductor device enters the self-refresh mode, a periodic output signal of an oscillator (not shown) is supplied to the refresh address counter 24 and the chip control circuit 28. As a result, a refresh operation is carried out automatically and periodically. After the semiconductor device enters the self-refresh mode, most of circuit blocks included in the peripheral circuit portion 20 are inactivated, resulting in a significant decrease in consumption current. During the period when the semiconductor device is in the self-refresh mode, row access and column access cannot be performed.

When a power-down command is issued, the semiconductor device enters a power-down mode. After the semiconductor device enters the power-down mode, most of circuit blocks included in the peripheral circuit portion 20 are inactivated, resulting in a significant decrease in consumption current. However, a refresh operation is not carried out. During the period when the semiconductor device is in the power-down mode, row access and column access cannot be performed.

When a mode register set command is issued, a mode signal that is supplied via the address terminal 41 is supplied to the mode register 25. As a result, the contents of the mode register 25 can be overwritten.

The clock terminals 43A and 43B are supplied with the external clock signals CK and /CK, respectively. The clock enable terminal 44 is supplied with a clock enable signal CKE. The external clock signals CK and /CK are complementary to each other, and are supplied to the clock generation circuit 27 together with the clock enable signal CKE. The clock generation circuit 27 is activated by the clock enable signal CKE, and generates an internal clock signal ICLK based on the external clock signals CK and /CK. The internal clock signal ICLK is supplied to most of circuit blocks included in the peripheral circuit portion 20, and is used as a timing signal that defines an operation timing thereof. Furthermore, the clock generation circuit 27 includes a DLL circuit 27A that generates a phase-controlled internal clock signal LCLK. The internal clock signal LCLK is supplied to the FIFO circuit 29B and the data input/output buffer 29C. As a result, during a read operation, read data is output from the data terminals in synchronization with the phase-controlled internal clock signal LCLK.

The power-supply terminals 46A to 46C are supplied with an external power-supply potential VDD, a ground potential VSS, and an external reference potential VREF, respectively. The power supply circuit 30 generates, based on the potentials VDD, VSS, and VREF, various internal voltages VPP, VARY, and VPERI. The internal voltage VPP is a voltage that is mainly used by the memory cell arrays 10, and is generated by boosting the external power-supply potential VDD. The internal voltage VARY is a voltage that is mainly used by the memory cell arrays 10, and is generated by stepping down the external power-supply potential VDD. The internal voltage VPERI is a voltage that is used by most of circuit blocks included in the peripheral circuit portion 20, and is generated by stepping down the external power-supply potential VDD. Incidentally, according to the present embodiment, among circuit blocks included in the peripheral circuit portion 20, to the data input/output buffer 29C, the external power-supply potential VDD is directly supplied. However, the present invention is not limited to the above.

Figure 2:
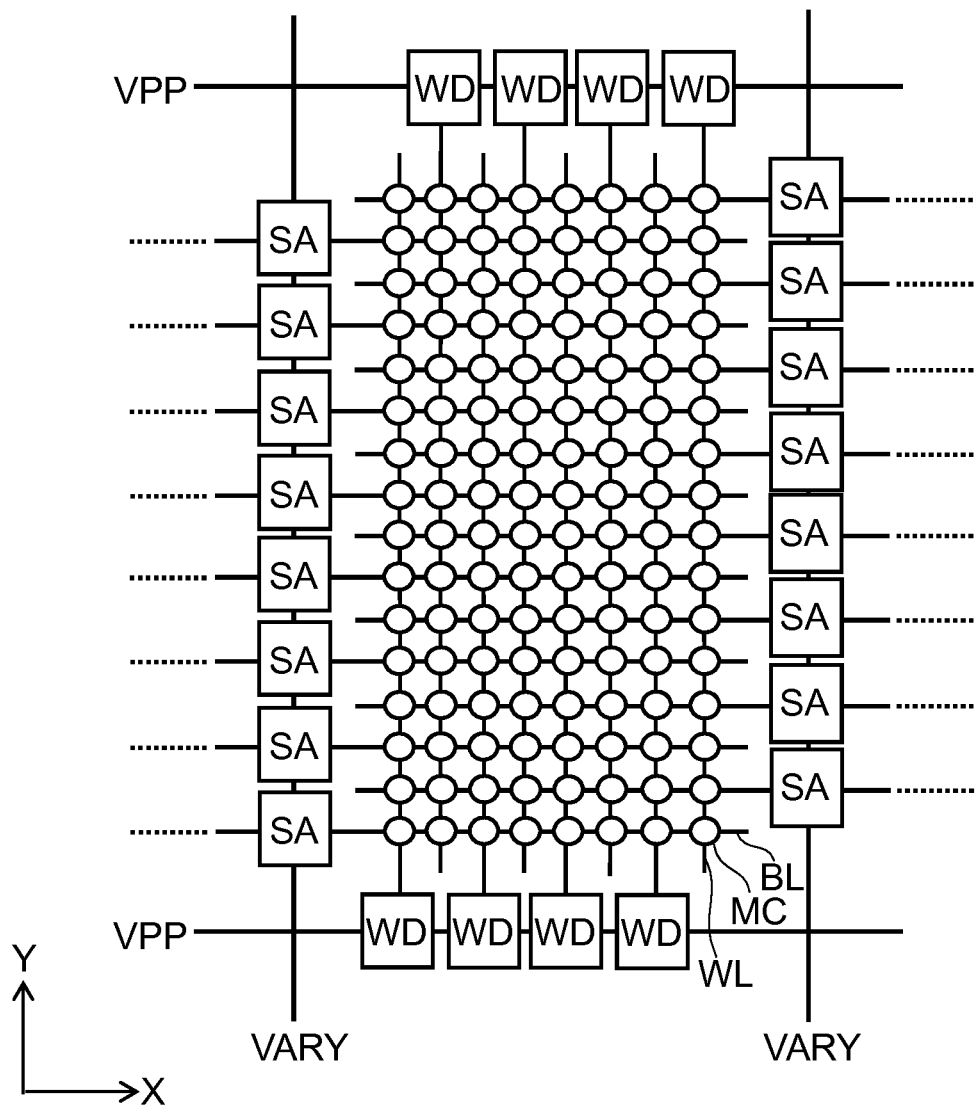
FIG. 2 is a circuit diagram showing the configuration of a memory cell array shown in FIG. 1.
Figure 3:
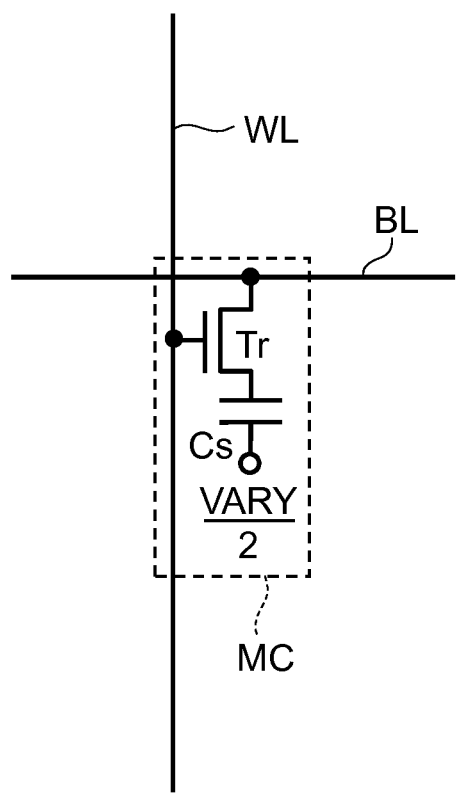
FIG. 3 shows a circuit configuration of a memory cell shown in FIG. 2.

Turning to FIG. 2, the memory cell array 10 includes a plurality of word lines WL which extend in a Y-direction and a plurality of bit lines BL which extend in an X-direction. On the intersection points of the word and bit lines, memory cells MC are disposed. FIG. 3 shows the circuit configuration of a memory cell MC, which has the structure in which a cell transistor Tr and a cell capacitor Cs are connected in series. The gate electrode of the cell transistor Tr is connected to a corresponding word line WL. One of the source and drain of the cell transistor Tr is connected to a corresponding bit line BL. One end of the cell capacitor Cs is connected to the other of the source and drain of the cell transistor Tr. An intermediate potential VARY/2 is supplied to the other end of the cell capacitor Cs. The intermediate potential VARY/2 is equal to half of the internal voltage VARY.

The word lines WL are driven by word drivers WD. A word driver WD is selected based on the address signal ADD that is supplied at the time of row access, and the selection is controlled by the row decoders 21X. The selected word driver WD drives a corresponding word line WL to the internal voltage VPP, which is a selection voltage. Although not specifically restricted, a word driver WD that is not selected drives a corresponding word line WL to a negative potential, which is a non-selection voltage.

After a predetermined word line WL is driven to the internal voltage VPP, data is read from a plurality of memory cells MC connected to the word line WL, and the potential of bit lines BL are changed. The change in the potential of the bit lines BL is amplified by sense amplifiers SA. To the sense amplifiers SA, a pair of bit lines BL is connected: one bit line BL is driven to the internal voltage VARY, the other bit line BL is driven to the ground potential VSS.

Figure 4:
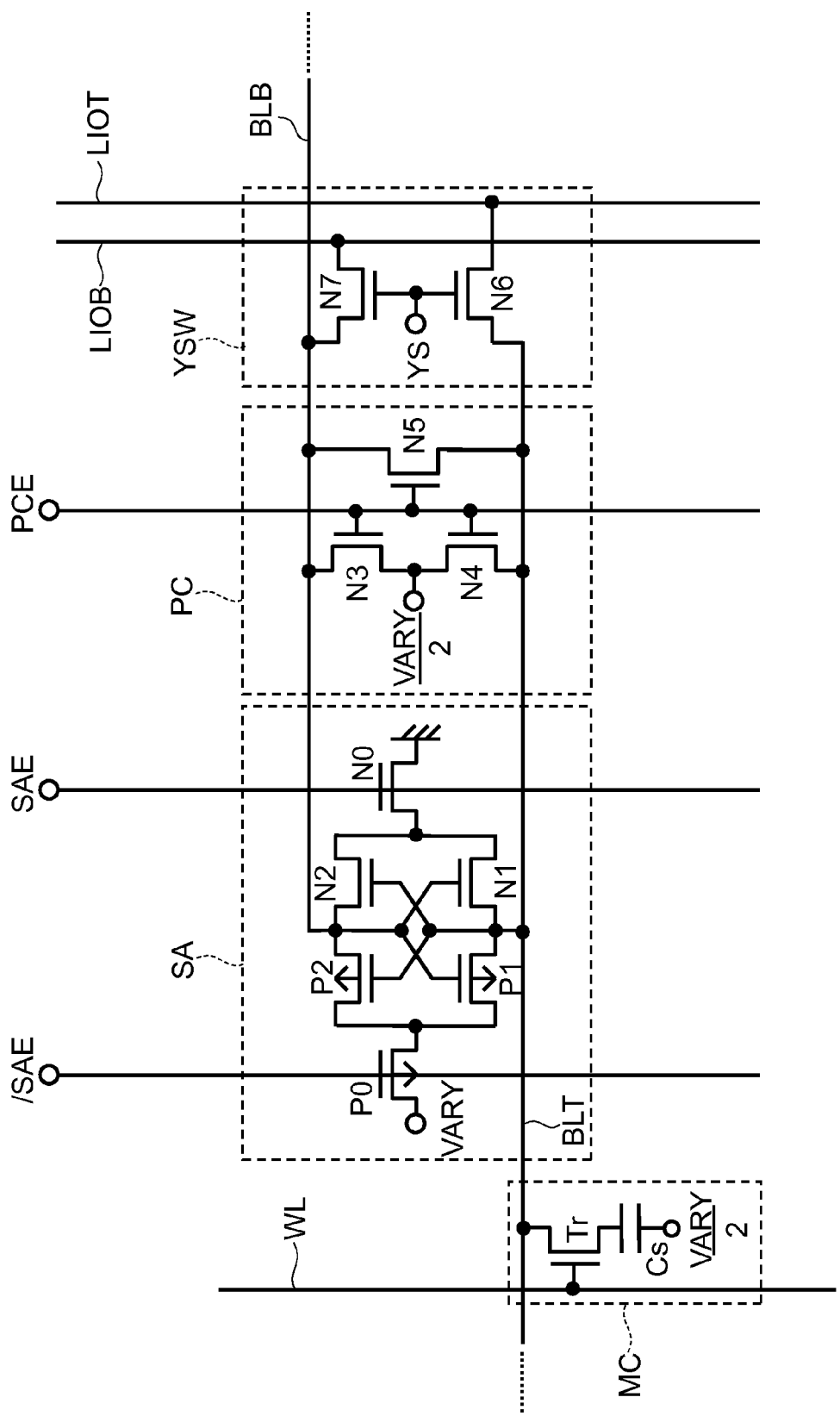
FIG. 4 is a circuit diagram of a sense amplifier shown in FIG. 2 and peripheral circuit blocks of the sense amplifier.

Turning to FIG. 4, the sense amplifier SA includes a flip-flop circuit composed of cross-coupled P-channel MOS transistors P1 and P2 and cross-coupled N-channel MOS transistors N1 and N2, and a P-channel MOS transistor P0, and a N-channel MOS transistor N0. The transistors P0 and No are designed to supply an operation voltage to the flip-flop circuit. A connection point of the transistors P1 and N1 is connected to one bit line BLT. A connection point of the transistors P2 and N2 is connected to the other bit line BLB. To the source of the transistor P0, an internal voltage VARY is supplied. To the source of the transistor N0, a ground potential VSS is supplied. To the gate electrodes of the transistors P0 and N0, sense amplifier enable signals /SAE and SAE which are complementary to each other are respectively supplied. When the sense amplifier enable signals /SAE and SAE are activated, one of the bit lines BLT and BLB is driven to the internal voltage VARY and the other to the ground potential VSS based on a difference in potential that appears between the paired bit lines BLT and BLB. The sense amplifier enable signals /SAE and SAE are assigned for each of a plurality of sense amplifiers SA. Sense amplifier enable signals /SAE and SAE that are to be activated are based on an address signal ADD that is supplied at the time of row access, and are controlled by the array control circuits 22.

As shown in FIG. 4, a pre-charge circuit PC is connected to a pair of bit lines BLT and BLB. The pre-charge circuit PC includes N-channel MOS transistors N3 to N5. To the gate electrodes of the N-channel MOS transistors N3 to N5, a pre-charge signal PCE is supplied. When the pre-charge signal PCE is activated, the pair of bit lines BLT and BLB is pre-charged to an intermediate potential VARY/2. The pre-charging operation is performed before an active command is issued. When the active command is issued, the pre-charging operation is cancelled. During the period when the semiconductor device is in a pre-charge power down mode, the pre-charging operation is performed.

As shown in FIG. 4, a column switch YSW is also connected to the pair of bit lines BLT and BLB. The column switch YSW includes N-channel MOS transistors N6 and N7. To the gate electrodes of the N-channel MOS transistors N6 and N7, a column select signal YS is supplied. When the column select signal YS is activated, the pair of bit lines BLT and BLB is connected to a pair of local I/O lines LIOT and LIOB. The column select signal YS is assigned for each of a plurality of column switches YSW. A column select signal YS is activated based on an address signal ADD that is supplied at the time of column access under the control of the column decoders 21Y.

The local I/O lines LIOT and LIOB are connected to the data control circuit 29A shown in FIG. 1 via a main I/O line not shown in the diagram. The data control circuit 29A includes a main amplifier that converts the read data from a differential-format into a single end format, and a write amplifier that converts the write data from a single end-format into a differential format. During a read operation, the read data that is output from the data control circuit 29A is delayed by the FIFO circuit 29B by an amount equivalent to CAS latency, and is supplied to the data input/output buffer 29C before being output to the outside through the data terminals 45. During a write operation, write data that is input into the data terminals 45 from the outside is supplied to the data control circuit 29A via the data input/output buffer 29C and the FIFO circuit 29B.

A register MR0 included in the mode register 25 will be explained with reference to FIG. 5.

The mode register 25 includes a plurality of registers MR0, MR1, and the like. In each of the registers MR0, MR1, and the like, a predetermined parameter is set in advance. The registers MR0, MR1, and the like are selected by bank addresses BA0 and BA1. When the logical values of the bank addresses BA0 and BA1 are all zero, the register MR0 shown in FIG. 5 is selected. The contents of the selected MR0, MR1, and the like are overwritten by an address signal ADD. According to the present embodiment, among address bits A0 to A14 that are set in the register MR0, address bits A13 and A14 are used for setting of a DVFS mode and address bits A2, A4, A5 and A6 are used for setting of CAS latency.

More specifically, when all the logical values of the address bits A14 and A13 are 0, the semiconductor device of the present embodiment is set to a low power consumption mode. Compared with in a standard mode, in the low power consumption mode, at least the external power-supply potential VDD or the internal voltage VPERI is set to a lower level. Moreover, the frequency of the external clock signals CK and /CK is set to a lower frequency. As a result, while the access speed is decreased, current consumption is reduced.

When all the logical values of the address bits A14 and A13 are 1, the semiconductor device of the present embodiment is set to a high-speed operation mode. Compared with in the standard mode, in the high-speed operation mode, at least the external power-supply potential VDD or the internal voltage VPERI is set to a higher level. Moreover, the frequency of the external clock signals CK and /CK is set to a higher frequency. As a result, while current consumption rises, the access speed is increased.

When the logical values of the address bits A14 and A13 are 0 and 1, respectively, the semiconductor device of the present embodiment is set to the standard mode. Incidentally, if the DVFS function is not used, the logical values of the address bits A14 and A13 are 1 and 0, respectively.

Figure 5:
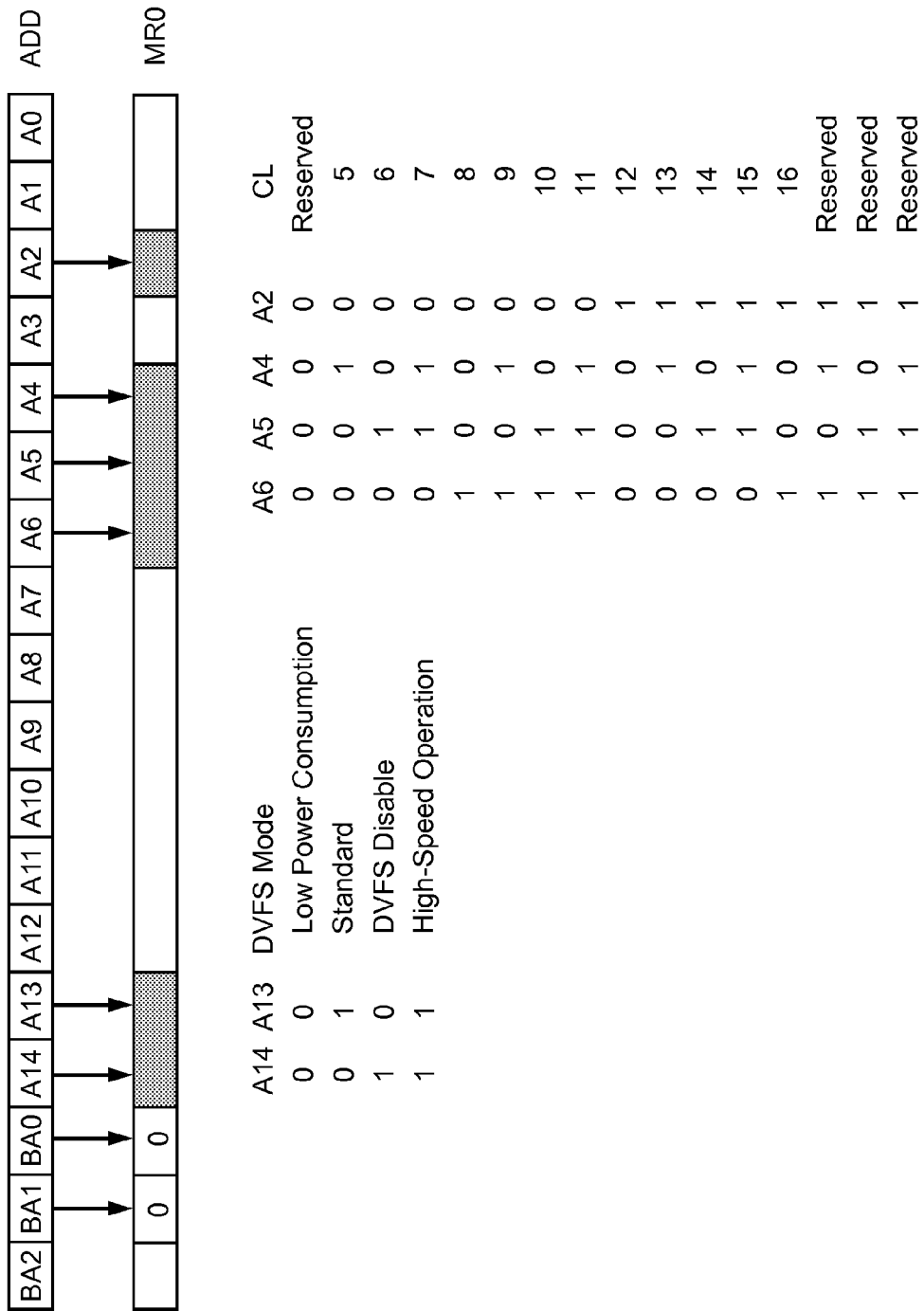
FIG. 5 is a schematic diagram showing the configuration of a register MR0 included in the mode register shown in FIG. 1.

The CAS latency (CL) is set to the values shown in FIG. 5 depending on the logical values of the address bits A2 and A4 to A6. The value of the CAS latency represents the number of clock cycles of the external clock signals CK and /CK.

Various parameters that are set in the mode register 25 are supplied to the chip control circuit 28 shown in FIG. 1. The chip control circuit 28 is designed to change operation modes of various circuit blocks included in the peripheral circuit portion 20 and the power supply circuit 30 based on the parameter supplied from the mode register 25. The following describes a process of changing voltage values of the external power-supply potential VDD or internal voltage VPERI in accordance with operation modes by using several examples with reference to FIGS. 6 to 8.

Figure 6:
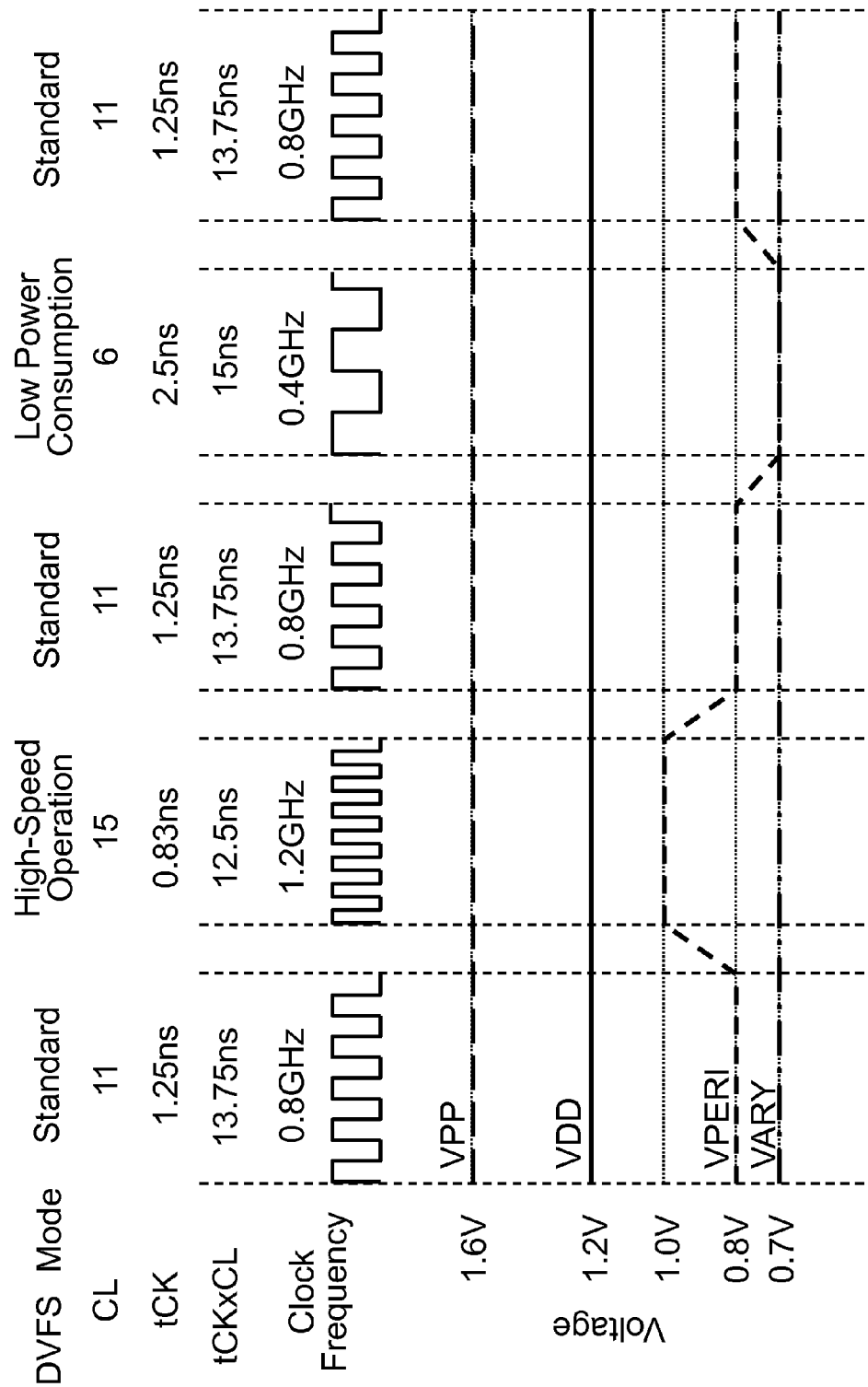
FIG. 6 is a diagram showing switching patterns of voltage values in a first example.

In the first example shown in FIG. 6, the voltage values of VPP, VDD, VPERI, and VARY for the standard mode are set to 1.6 V, 1.2 V, 0.8 V, and 0.7 V, respectively. Moreover, the frequency of the external clock signals CK and /CK is set to 0.8 GHz (tCK=1.25 ns). In this case, the value of CL is set to 11, meaning that the duration of tCK×CL is 13.75 ns.

When the high-speed operation mode is selected, VPERI is so changed as to be equal to 1.0 V. Moreover, the frequency of the external clock signals CK and /CK is switched to 1.2 GHz (tCK=0.83 ns). In this case, the value of CL is set to 15, meaning that the duration of tCK×CL is 12.5 ns.

When the low power consumption mode is selected, VPERI is so switched as to be equal to 0.7V. Moreover, the frequency of the external clock signals CK and /CK is switched to 0.4 GHz (tCK=2.5 ns). In this case, the value of CL is set to 6, meaning that the duration of tCK×CL is 15 ns.

In that manner, in the first example shown in FIG. 6, depending on the operation mode, the frequency of the external clock signals CK and /CK is changed, and the voltage value of the internal voltage VPERI is changed. The voltage value of the external power-supply potential VDD is not changed depending on the operation mode. As a result, the switching speed of transistors included in the peripheral circuit portion 20, and the transmission speeds of signals vary according to the operation mode. Therefore, it is possible to achieve high-speed access in the high-speed operation mode, as well as to reduce current consumption in the low power consumption mode.

Meanwhile, the internal voltages VPP and VARY that are used in the memory cell arrays 10 are not changed depending on the operation mode. The reason is that, if the internal voltage VPP is changed, the ON state of the cell transistor Tr is changed, thereby altering reading characteristics and writing characteristics of data from the cell capacitor Cs; and that, if the internal voltage VARY is changed, the level of data written into the cell capacitor Cs is changed. If the above characteristics are changed in the memory cell arrays 10, an operating margin of the memory cell arrays 10 is reduced. As a result, in some cases, the good operation may not be performed.

According to the present embodiment, in any operation mode, the internal voltages VPP and VARY are fixed to predetermined voltage values. Therefore, the operating margin of the memory cell arrays 10 is not deteriorated. Moreover, the value of CL varies according to the operation mode. Therefore, regardless of the operation mode, the duration of tCK×CL is substantially constant. Although not specifically restricted, according to the present embodiment, a difference in the duration of tCK×CL between the operation modes is set to a value corresponding to the internal voltage VPERI. Therefore, the actual period of time from when a read command is issued until when read data is output can be an optimal value corresponding to an operation mode. According to the present embodiment, the duration of tCK×CL in the low power consumption mode is slightly larger than the duration of tCK×CL in the standard mode. The duration of tCK×CL in the standard mode is slightly larger than the duration of tCK×CL in the high-speed operation mode. Incidentally, although not shown in FIG. 6, it is preferred that the value of CAS write latency CWL also vary according to the operation mode.

Figure 9C:
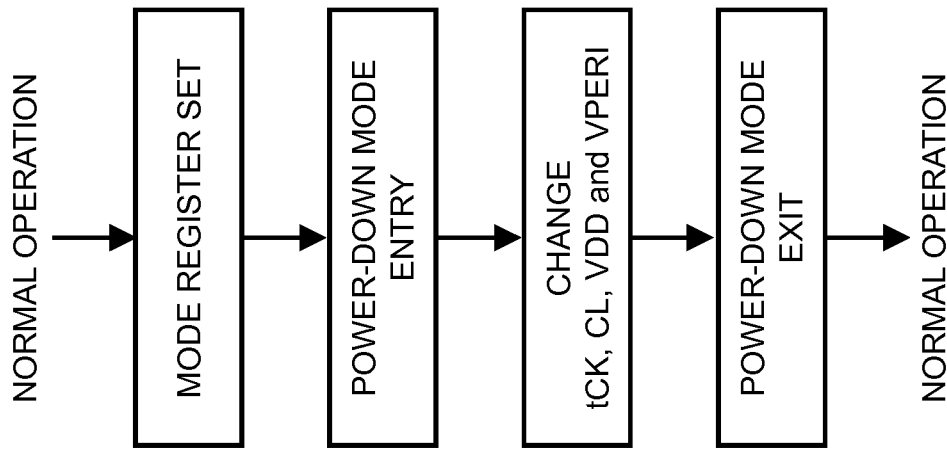
FIG. 9C is a flowchart showing a switching of operation modes shown in FIG. 8.
Figure 9B:
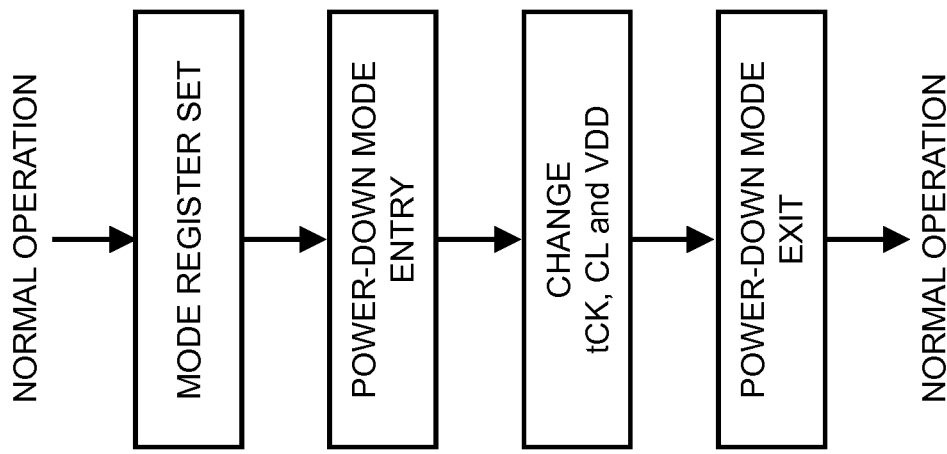
FIG. 9B is a flowchart showing a switching of operation modes shown in FIG. 7.
Figure 9A:
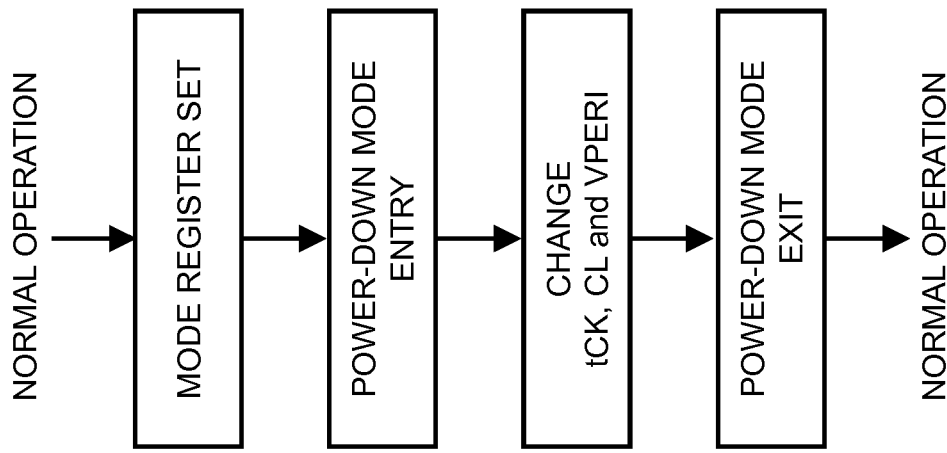
FIG. 9A is a flowchart showing a switching of operation modes shown in FIG. 6.

The operation modes can be switched during the period when the semiconductor device is in the power-down mode. That is, as shown in FIG. 9A, during the normal operation, a mode register set command is issued so that the set values of the mode register 25 shown in FIG. 5 are rewritten, and the semiconductor device enters the power-down mode. During the period when the semiconductor device is in the power-down mode, tCK, CL, and the VPERI level are changed; the semiconductor device then exits from the power-down mode. In this manner, without affecting the normal operation, the operation modes are changed. Incidentally, the changing of operation modes is not limited to the period when the semiconductor device is in the power-down mode; the changing of operation modes may be performed during the period when the semiconductor device is in the self-refresh mode.

Figure 7:
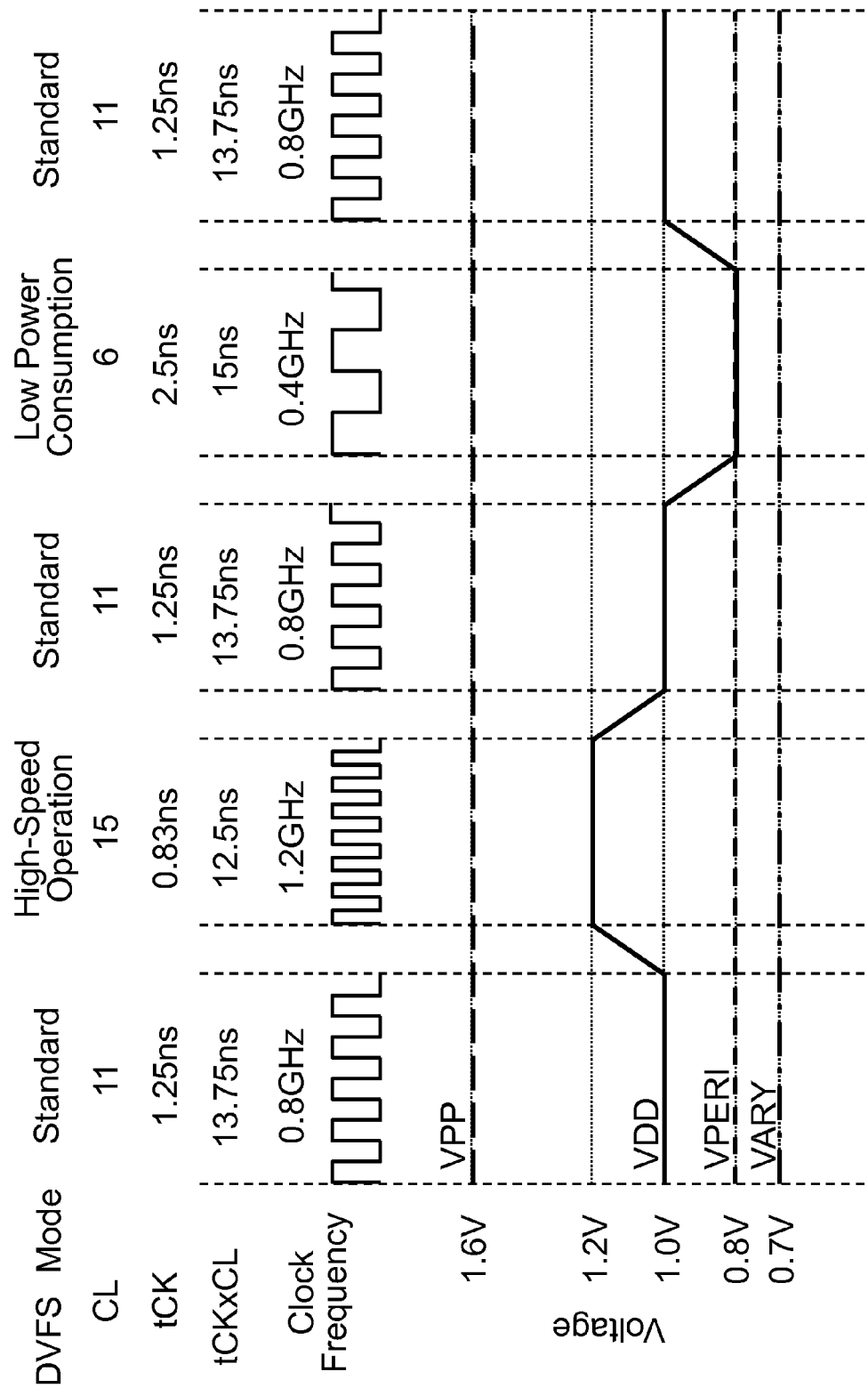
FIG. 7 is a diagram showing switching patterns of voltage values in a second example.

In the second example shown in FIG. 7, the voltage value of the internal voltage VPERI does not change according to the operation mode, but the voltage value of the external power-supply potential VDD changes according to the operation mode. More specifically, when the high-speed operation mode is selected, the external power-supply potential VDD is so changed as to be equal to 1.2 V. When the low power consumption mode is selected, the external power-supply potential VDD is so changed as to be equal to 0.8 V. However, the voltage value of the internal voltage VPERI remains unchanged. The other operations are the same as those in the first example, and are therefore not described. Even in the present example, the internal voltages VPP and VARY that are used in the memory cell arrays 10 are not changed depending on the operation mode. Therefore, the operating margin of the memory cell arrays 10 is not deteriorated. Incidentally, as for the changing of operation modes, as shown in FIG. 9B, during the normal operation, a mode register set command is issued, so that the set values of the mode register 25 shown in FIG. 5 are rewritten, and the semiconductor device enters the power-down mode. During the period when the semiconductor device is in the power-down mode, tCK, CL, and the VDD level are changed; the semiconductor device then exits from the power-down mode.

Figure 8:
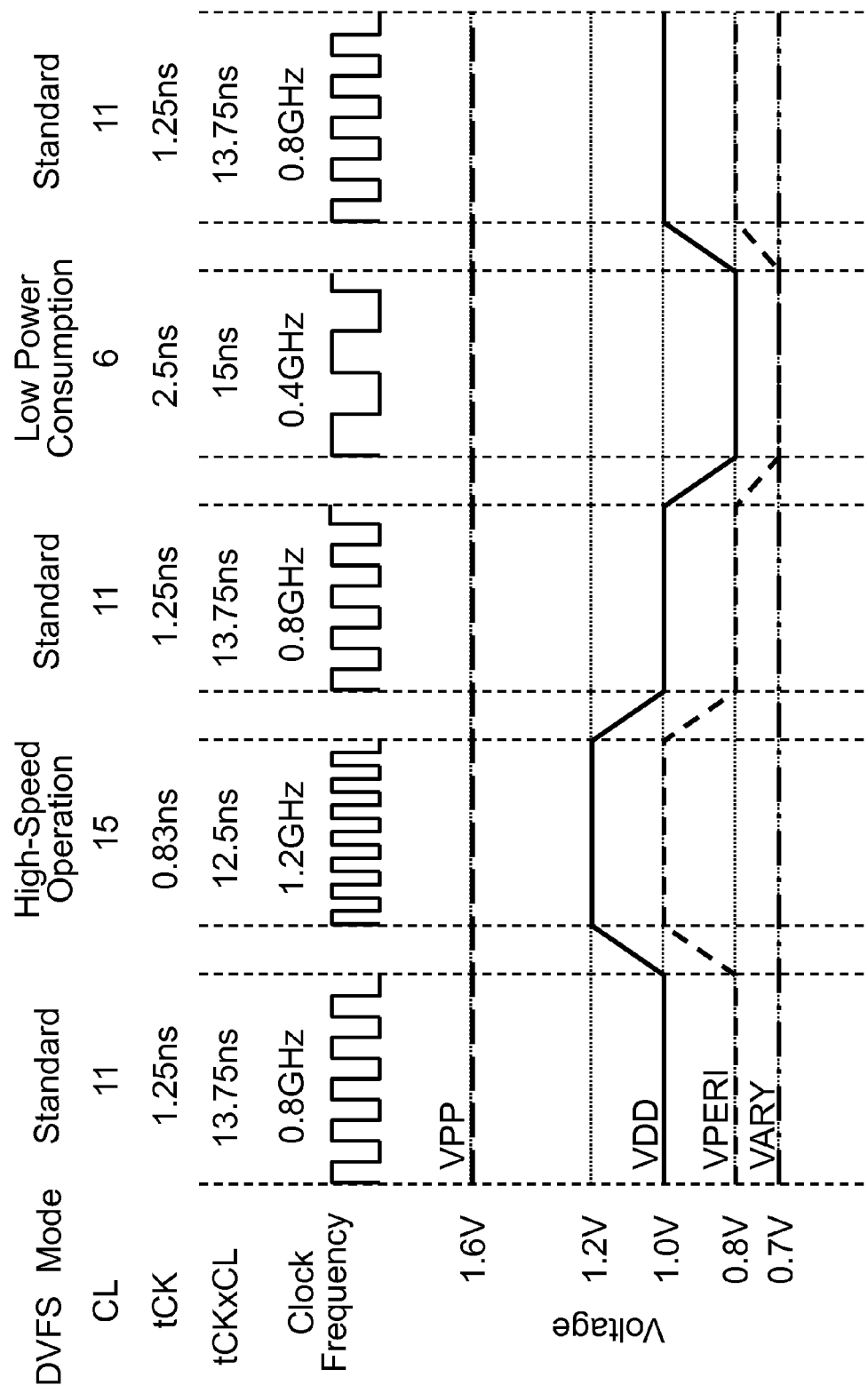
FIG. 8 is a diagram showing switching patterns of voltage values in a third example.

In the third example shown in FIG. 8, the voltage value of both the internal voltage VPERI and the external power-supply potential VDD changes according to the operation mode. More specifically, when the high-speed operation mode is selected, the potentials VPERI and VDD are so changed as to be equal to 1.0 V and 1.2 V, respectively. When the low power consumption mode is selected, the potentials VPERI and VDD are so changed as to be equal to 0.7 V and 0.8 V, respectively. The other operations are the same as those in the first example, and are therefore not described. Even in the present example, the internal voltages VPP and VARY that are used in the memory cell arrays 10 are not changed depending on the operation mode. Therefore, the operating margin of the memory cell arrays 10 is not deteriorated. Incidentally, as for the changing of operation modes, as shown in FIG. 9C, during the normal operation, a mode register set command is issued, so that the set values of the mode register 25 shown in FIG. 5 are rewritten, and the semiconductor device enters the power-down mode. During the period when the semiconductor device is in the power-down mode, tCK, CL, VPERI, and the VDD level are changed; the semiconductor device then exits from the power-down mode.

Among the parameters that are changed depending on the operation mode, the voltage value of the external power-supply potential VDD, and the frequency of the external clock signals CK and /CK are selected at the side of an external controller, which controls the semiconductor device of the present embodiment. The voltage value of the internal voltage VPERI is changed at the side of the semiconductor device. The value of the CAS latency may be specified at the side of the external controller at a time when the set values of the mode register 25 are rewritten; or may be automatically set at the side of the semiconductor device depending on a selected operation mode.

A possible relationship between the external power-supply potential VDD and the internal voltages VPP, VARY, and VPERI will be explained with reference to FIGS. 10A and 10B.

Figure 10B:
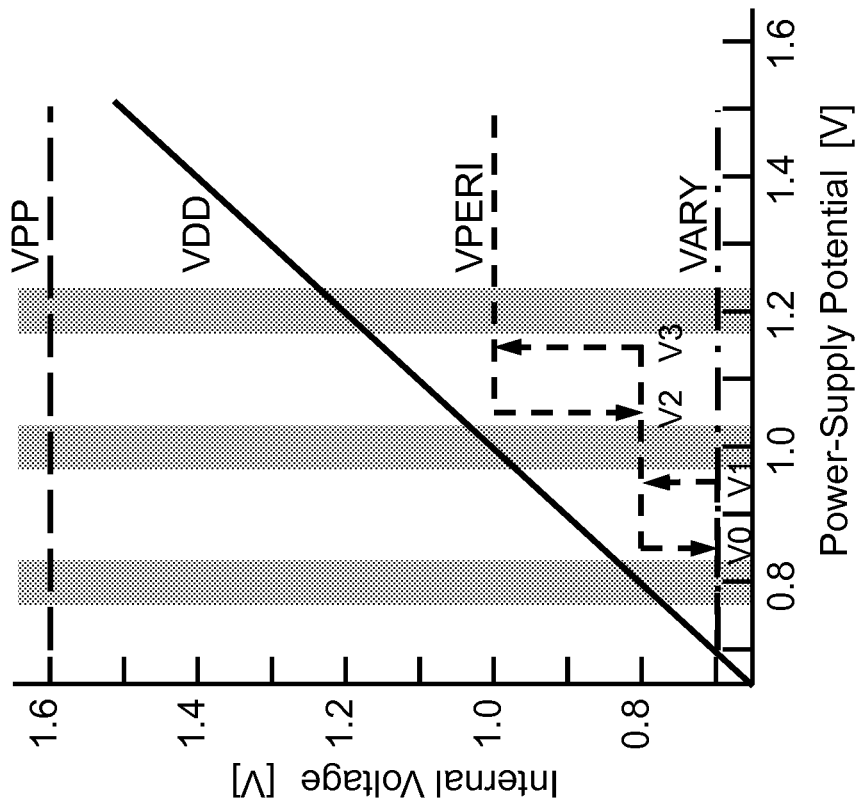
FIGS. 10A and 10B are graphs showing the relationship between the external power-supply potential VDD and the internal voltages VPP, VARY, and VPERI.
Figure 10A:
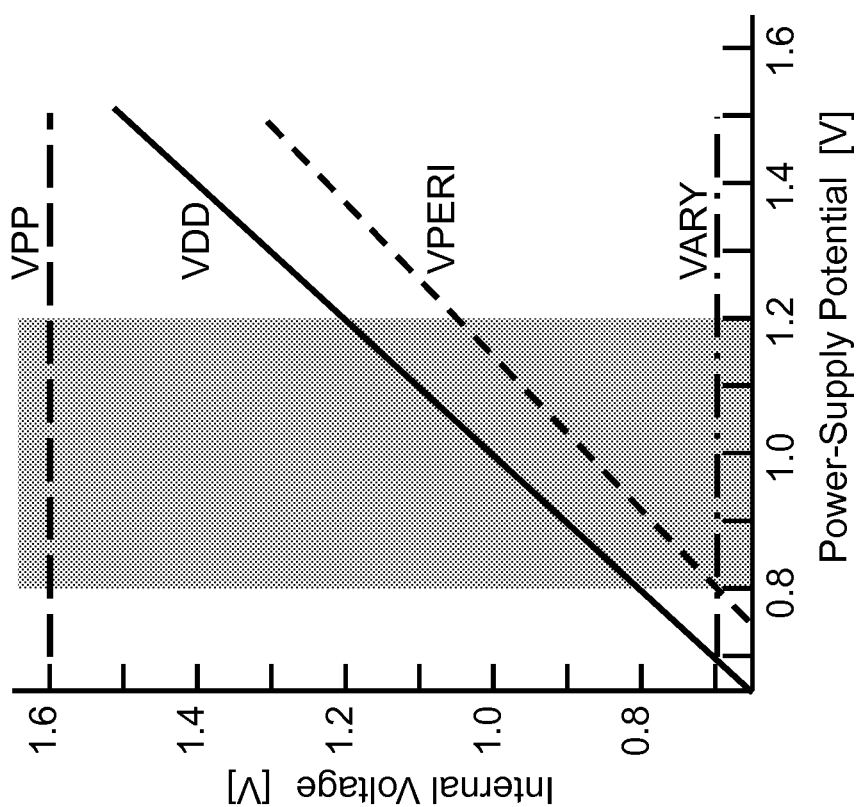

In the first example shown in FIG. 10A, the internal voltage VPERI is linearly changed according to the external power-supply potential VDD. In the range of 0.8 V to 1.2 V, which is a setting range of the external power-supply potential VDD, the internal voltage VPERI, too, is linearly changed. Incidentally, the shaded portion in FIG. 10A is the setting range of the external power-supply potential VDD.

In the second example shown in FIG. 10B, the internal voltage VPERI is changed in stages according to the external power-supply potential VDD. In particular, hysteresis is given to the internal voltage VPERI varying according to the external power-supply potential VDD. More specifically, a threshold voltage of the external power-supply potential VDD, which is a switching point of the internal voltage VPERI, is set to V0 to V3 (V0<V1<V2<V3). When the voltage value of the external power-supply potential VDD goes up from less than V1 to V1 or a higher level, the voltage value of the internal voltage VPERI is switched from 0.7 V to 0.8 V. When the voltage value of the external power-supply potential VDD goes up from less than V3 to V3 or a higher level, the voltage value of the internal voltage VPERI is switched from 0.8 V to 1.0 V. When the voltage value of the external power-supply potential VDD goes down from V2 or a higher level to less than V2, the voltage value of the internal voltage VPERI is switched from 1.0 V to 0.8 V. When the voltage value of the external power-supply potential VDD goes down from V0 or a higher level to less than V0, the voltage value of the internal voltage VPERI is switched from 0.8 V to 0.7 V.

In this case, a difference in potential to some extent is given between the threshold voltages V0 to V3 and the set values of the external power-supply potential VDD, which are 0.8 V, 1.0 V, and 1.2 V. More specifically, the threshold voltage V0 is set to a level that is sufficiently lower than 1.0 V but slightly higher than 0.8 V. The threshold voltage V1 is set to a level that is sufficiently higher than 0.8 V but slightly lower than 1.0 V. The threshold voltage V2 is set to a level that is sufficiently lower than 1.2 V but slightly higher than 1.0 V. The threshold voltage V3 is set to a level that is sufficiently higher than 1.0V but slightly lower than 1.2 V. Therefore, even as the external power-supply potential VDD is slightly changed, the internal voltage VPERI is not switched unintentionally. Incidentally, the shaded portions shown in FIG. 10B represent ranges near the set values of the external power-supply potential VDD. It is clear that the threshold voltages V0 to V3 are set outside the shaded ranges.

Figure 11:
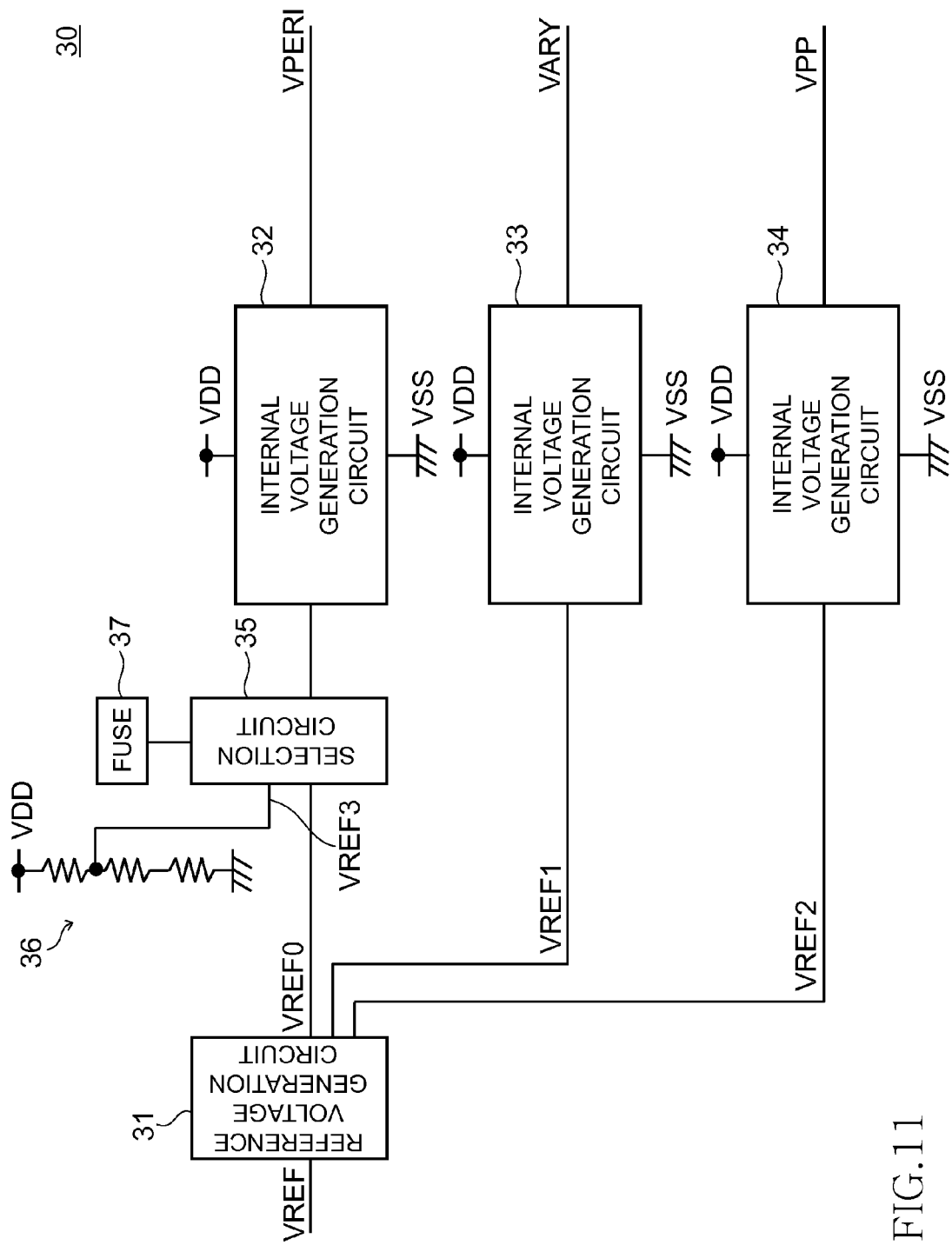
FIG. 11 is a block diagram of the power supply circuit shown in FIG. 1 in a first example.

Turning to FIG. 11. the power supply circuit 30 in the second example includes a reference voltage generation circuit 31 that generates internal reference potentials VREF0 to VREF2 by dividing an external reference potential VREF, and internal voltage generation circuits 32 to 34 that generates internal voltages VPERI, VARY and VPP, respectively. The voltage values of the internal reference potentials VREF0 to VREF2 generated by the reference voltage generation circuit 31 are fixed values that are based on the external reference potential VREF. Accordingly, the internal voltage generation circuits 33 and 34, to which the internal reference potentials VREF1 and VREF2 are supplied without being changed, generate the internal voltages VARY and VPP of constant levels on the basis of the internal reference potentials VREF1 and VREF2. That is, even when the operation modes are changed, or when the external power-supply potential VDD is changed, the above voltage values remain unchanged. Incidentally, instead of using the external reference potential VREF, a reference potential VREF may be generated inside the chip.

The internal reference potential VREF0 is supplied to the internal voltage generation circuit 32 via a selection circuit 35. A reference potential VREF3 is also supplied to the selection circuit 35. A resistive voltage divider circuit 36 generates the reference potential VREF3 by dividing the external power-supply potential VDD. A potential that is to be supplied to the internal voltage generation circuit 32 is selected based on data that is written into a fuse circuit 37. Therefore, when the selection circuit selects the internal reference potential VREF0, an internal voltage VPERI of a constant level is generated based on the internal reference potential VREF0. That is, even when the operation modes are changed, or when the external power-supply potential VDD is changed, the voltage value of the internal voltage VPERI remains unchanged. This operation corresponds to the case where the voltages are changed in the example shown in FIG. 7. When the selection circuit 35 selects the divided reference potential VREF3, the voltage value of the internal voltage VPERI linearly changes as the external power-supply potential VDD changes as shown in FIG. 9A. This operation corresponds to the case where the voltages are changed in the example shown in FIG. 8.

Figure 12:
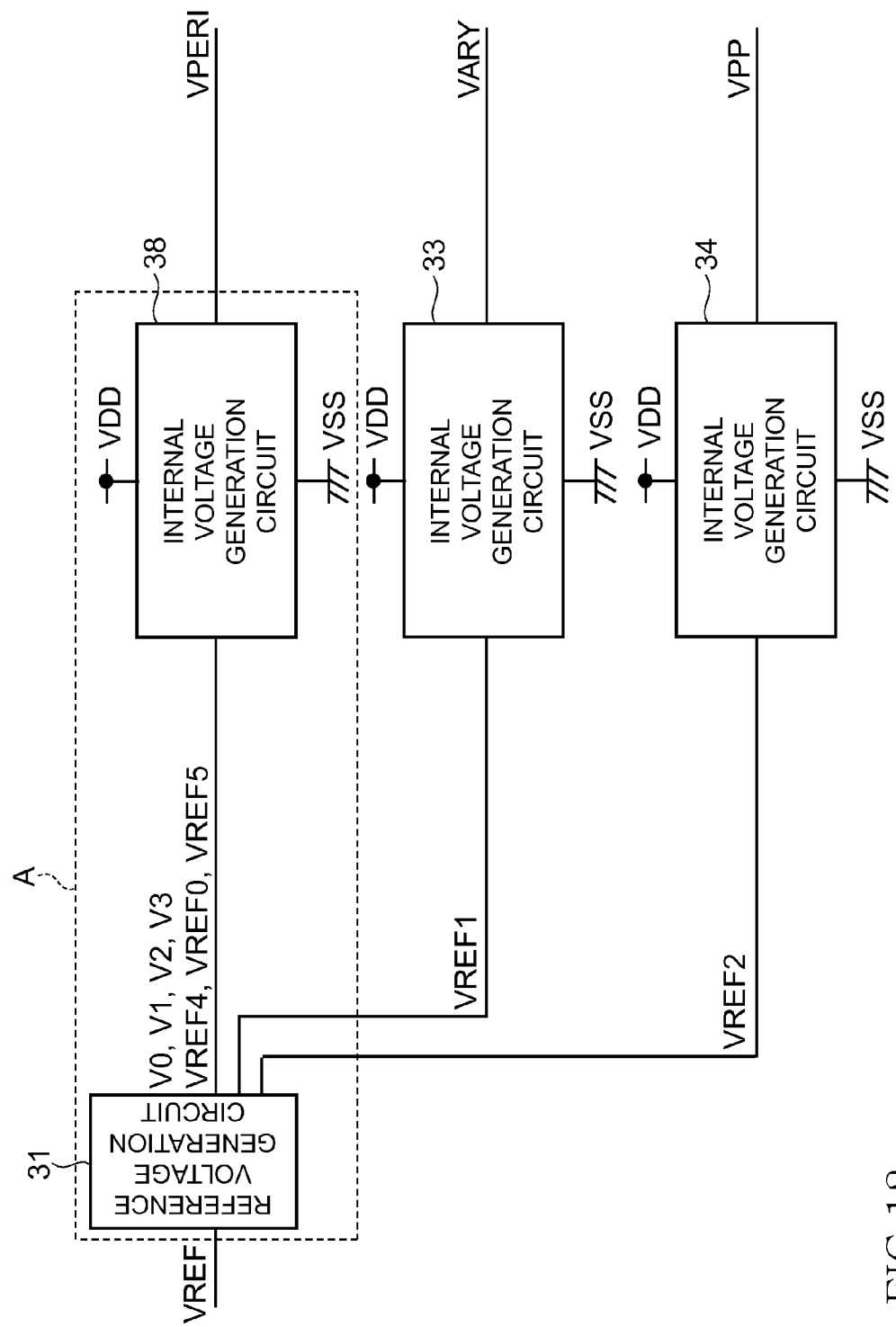
FIG. 12 is a block diagram of the power supply circuit shown in FIG. 1 in a second example.

Turning to FIG. 12, the power supply circuit 30 in the second example is different from the power supply circuit 30 shown in FIG. 11 in that an internal voltage generation circuit 38 is used instead of the internal voltage generation circuit 32 shown in FIG. 11. As in the case of the power supply circuit 30 shown in FIG. 11, the internal reference potentials VREF1 and VREF2 are supplied without being changed to the internal power-supply generation circuits 33 and 34, respectively. Therefore, regardless of a selection of the operation modes or changing of the external power-supply potential VDD, the internal voltages VARY and VPP of constant levels are generated.

Figure 13:
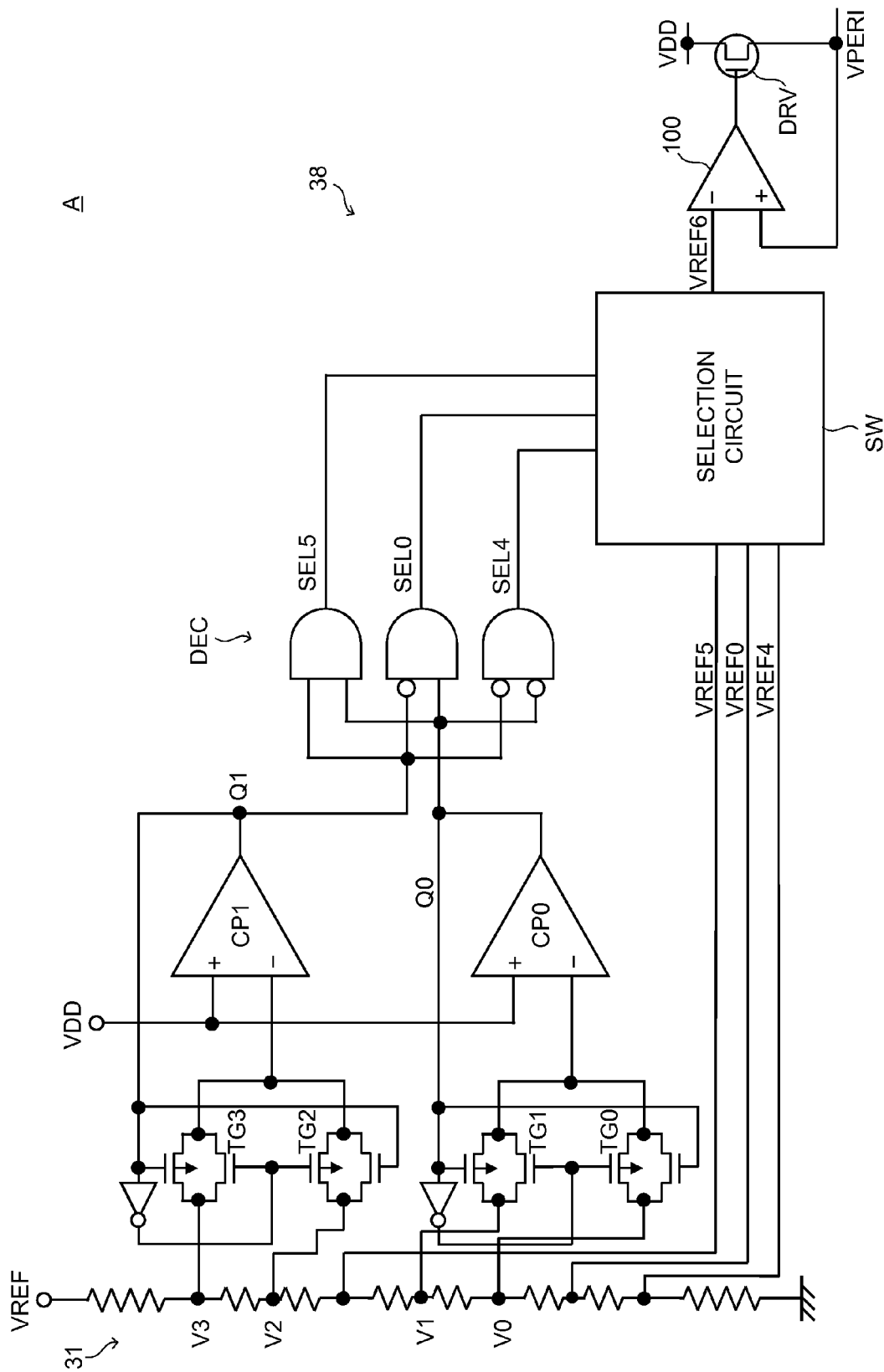
FIG. 13 is a circuit diagram showing a circuit block A shown in FIG. 12 in more detail.

As shown in FIG. 13, the circuit block A shown in FIG. 12 includes a reference voltage generation circuit 31 and the internal power-supply generation circuit 38.

The reference voltage generation circuit 31 includes a plurality of resistive elements that are connected in series between a power supply line that an external reference potential VREF is supplied and a power supply line that a ground potential VSS is supplied. Various voltages V0 to V3, VREF0, VREF4, and VREF5 can be obtained from each connection point of the resistive elements, and are supplied to the internal voltage generation circuit 38. The threshold voltages V0 to V3 are designed as follows:

0.8 V<V0<V1<1.0V<V2<V3<1.2 V

For example, the reference potential VREF4 is 0.7 V, the reference potential VREF0 is 0.8 V, and the reference potential VREF5 is 1.0 V. Incidentally, instead of using the external reference potential VREF, a reference potential VREF may be generated inside the chip.

The internal voltage generation circuit 38 includes transfer gate circuits TG0 to TG3, to which the threshold voltages V0 to V3 are respectively supplied. On the basis of the logical value of a determination signal Q0, one of the transfer gate circuits TG0 and TG1 is turned ON, and the other transfer gate circuit OFF. A voltage that has passed through the transfer gate circuits TG0 and TG1 is supplied to an inverting input node (−) of a comparator CP0 that generates the determination signal Q0. To a non-inverting input node (+) of the comparator CP0, the external power-supply potential VDD is supplied. Similarly, on the basis of the logical value of a determination signal Q1, one of the transfer gate circuits TG2 and TG3 is turned ON, and the other transfer gate circuit OFF. A voltage that has passed through the transfer gate circuits TG2 and TG3 is supplied to an inverting input node (−) of a comparator CP1 that generates the determination signal Q1. To a non-inverting input node (+) of the comparator CP1, the external power-supply potential VDD is supplied.

In the above configuration, if the external power-supply potential VDD is about 0.8 V, both the determination signals Q0 and Q1 are at a low level. If the external power-supply potential VDD is about 1.0 V, the determination signal Q0 is at a high level and the determination signal Q1 at a low level. If the external power-supply potential VDD is about 1.2 V, both the determination signals Q0 and Q1 are at a high level. The determination signals Q0 and Q1 are input into a decoder DEC. As a result, if the external power-supply potential VDD is about 0.8 V, a selection signal SEL4 is activated. If the external power-supply potential VDD is about 1.0 V, a selection signal SEL0 is activated. If the external power-supply potential VDD is about 1.2 V, a selection signal SEL5 is activated.

The selection signals SEL0, SEL4, and SEL5 are supplied to a selection circuit SW. The selection circuit SW selects the internal reference potential VREF4 when the selection signal SEL4 is activated. The selection circuit SW selects the internal reference potential VREF0 when the selection signal SEL0 is activated. The selection circuit SW selects the internal reference potential VREF5 when the selection signal SEL5 is activated. An internal reference potential VREF6, which is output as a result of the selection, is supplied to an inverting input node (−) of a differential amplifier circuit 100. An output of the differential amplifier circuit 100 is supplied to the gate electrode of a driver transistor DRV, which generated the internal voltage VPERI. The generated internal voltage VPERI is fed back to a non-inverting input node (+) of the differential amplifier circuit 100.

Accordingly, if the external power-supply potential VDD is about 0.8V, the voltage value of the internal voltage VPERI is so controlled as to be VREF4 (=0.7 V). If the external power-supply potential VDD is about 1.0 V, the voltage value of the internal voltage VPERI is so controlled as to be VREF0 (=0.8 V). If the external power-supply potential VDD is about 1.2 V, the voltage value of the internal voltage VPERI is so controlled as to be VREF5 (=1.0 V).

When the external power-supply potential VDD is changed from 0.8 V to 1.0 V, the voltage value of the internal voltage VPERI is switched to VREF0 (=0.8 V) in response to the fact that the external power-supply potential VDD has exceeded the threshold voltage V1. At this time, the threshold voltage V1 is set to a level that is sufficiently higher than 0.8 V. Therefore, the internal voltage VPERI is not changed unintentionally. When the external power-supply potential VDD is changed from 1.0 V to 1.2 V, the voltage value of the internal voltage VPERI is changed to VREF5 (=1.0 V) in response to the fact that the external power-supply potential VDD has exceeded the threshold voltage V3. At this time, the threshold voltage V3 is set to a level that is sufficiently higher than 1.0 V. Therefore, the internal voltage VPERI is not switched unintentionally.

When the external power-supply potential VDD is changed from 1.2 V to 1.0V, the voltage value of the internal voltage VPERI is switched to VREF0 (=0.8 V) in response to the fact that the external power-supply potential VDD has exceeded the threshold voltage V2. At this time, the threshold voltage V2 is set to a level that is sufficiently lower than 1.2 V. Therefore, the internal voltage VPERI is not changed unintentionally. When the external power-supply potential VDD is changed from 1.0 V to 0.8 V, the voltage value of the internal voltage VPERI is changed to VREF4 (=0.7 V) in response to the fact that the external power-supply potential VDD has exceeded the threshold voltage V0. At this time, the threshold voltage V0 is set to a level that is sufficiently lower than 1.0 V. Therefore, the internal voltage VPERI is not switched unintentionally.

According to the above operation, as shown in FIG. 10B, as the external power-supply potential VDD is changed, the voltage value of the internal voltage VPERI is changed in stages. This operation corresponds to the case where the voltages are changed in the example shown in FIG. 8. Since hysteresis is given to the internal voltage VPERI varying according to the external power-supply potential VDD, it is possible to prevent the internal voltage VPERI from being changed unintentionally even as the external power-supply potential VDD is slightly changed.

Figure 14:
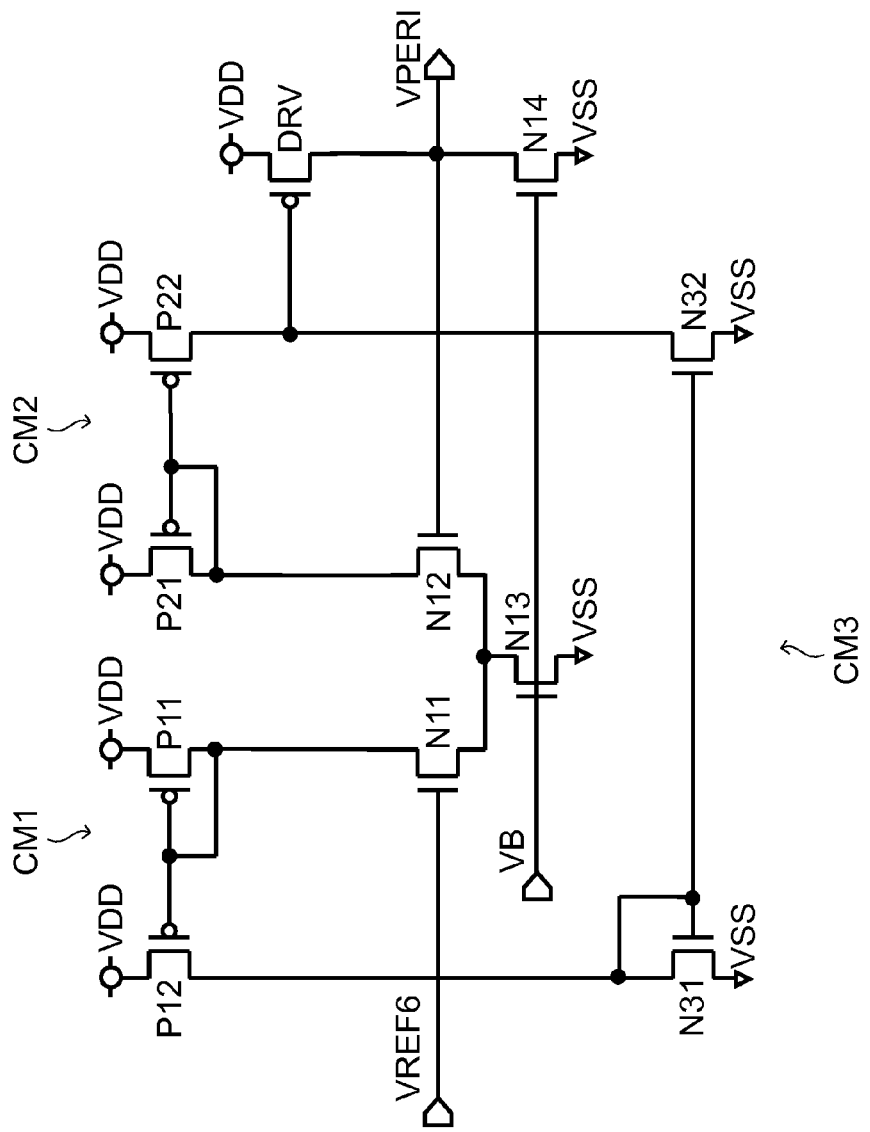
FIG. 14 is a circuit diagram of the differential amplifier circuit shown in FIG. 13 in a first example.

Turning to FIG. 14, the differential amplifier circuit 100 in the first example includes an input transistor N11 to which the internal reference potential VREF6 output from the selection circuit SW is supplied, an input transistor N12 to which the internal voltage VPERI is fed back, and a bias transistor N13 that supplies a bias current to the common source of the input transistors N11 and N12. To the gate electrode of the bias transistor N13, a bias voltage VB is supplied. As a result, through the input transistors N11 and N12, a predetermined bias current flows. Moreover, the bias voltage VB is also supplied to the gate electrode of a bias transistor N14 that is connected between a driver transistor DRV and a ground line. Incidentally, the voltage value of the bias voltage VB supplied to the bias transistor N13 may be different from the voltage value of the bias voltage VB supplied to the bias transistor N14.

A current flowing through the input transistor N11 is input into a current mirror circuit CM1 that includes transistors P11 and P12. An output current of the current mirror circuit CM1 is input into a current mirror circuit CM3 that includes transistors N31 and N32. Similarly, a current flowing through the input transistor N12 is input into a current mirror circuit CM2 that includes transistors P21 and P22. Output nodes of the current mirror circuits CM2 and CM3 are short-circuited. Thus, the difference current between an output current of the current mirror circuit CM2 and output current of the current mirror circuit CM3 flows to/from the gate electrode of the driver transistor DRV. As a result, the driver transistor DRV is so controlled that the voltage value of the internal voltage VPERI becomes equal to the internal reference potential VREF6.

The differential amplifier circuit 100 shown in FIG. 14 can amplify the signal input to the gate electrode of the driver transistor DRV from VDD to VSS. Therefore, it is possible to obtain a high current supply capability.

Figure 15:
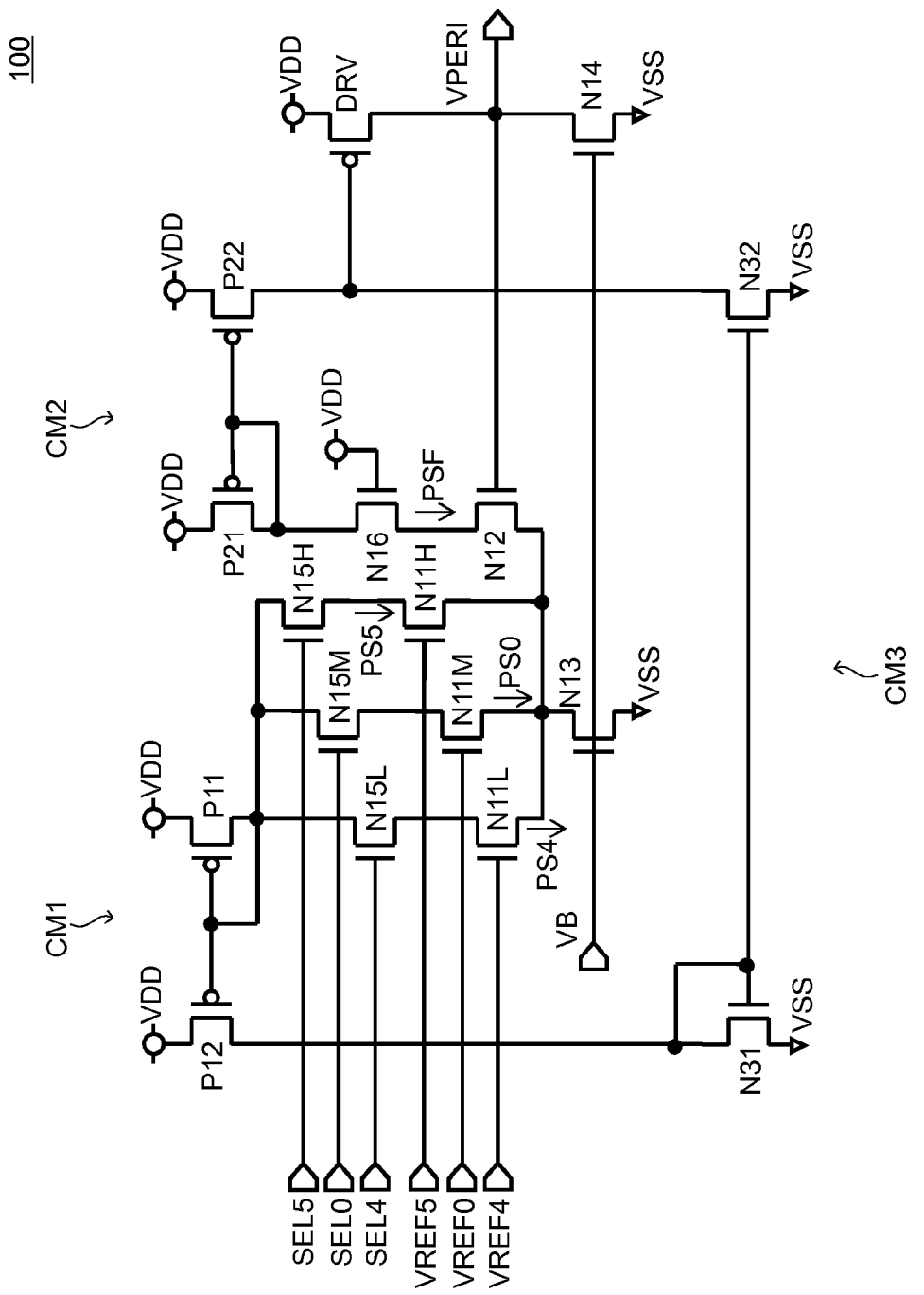
FIG. 15 is a circuit diagram of the differential amplifier circuit shown in FIG. 13 in a second example.

Turning to FIG. 15, the differential amplifier circuit 100 in the second example has a structure in which the selection circuit SW shown in FIG. 13 is added integrally. That is, a plurality of current paths PS4, PS0 and PS5 are provided to allow currents that are based on the internal reference potentials VREF4, VREF0 and VREF5 to flow therethrough. Based on the selection signals SEL0, SEL4 and SEL5, only one of the current paths is activated. More specifically, the following paths are provided in parallel: the current path PS4 includes an input transistor N11L and a switch transistor N15L connected in series; the current path PS0 includes an input transistor N11M and a switch transistor N15M connected in series; and the current path PS5 includes an input transistor N11H and a switch transistor N15H connected in series. To the gate electrodes of the input transistors N11L, N11M, and N11H, the internal reference potentials VREF4, VREF0 and VREF5 are respectively supplied. To the gate electrodes of the switch transistors N15L, N15M and N15H, the selection signals SEL4, SEL0 and SEL5 are respectively supplied.

Incidentally, in order to take a balance with the input-side current path, a switch transistor N16 is inserted into a feedback-side current path PSF. To the gate electrode of the switch transistor N16, the external power-supply potential VDD is supplied. The configuration of the other portions is the same as that of the differential amplifier circuit 100 shown in FIG. 14. Therefore, the same components are represented by the same reference symbols, and are not described again.

In the above configuration, on the basis of the selection signals SEL4, SEL0 and SEL5, one of the current paths PS4, PS0 and PS5 is selected. Therefore, the same operation as that of the differential amplifier circuit 100 shown in FIG. 14 can be performed. Moreover, the differential amplifier circuit 100 shown in FIG. 15 is able to select the voltage value of the internal voltage VPERI at a higher speed than the differential amplifier circuit 100 shown in FIG. 14. The reason is that, while it takes time to select the voltage value of the internal reference potential VREF6 in the differential amplifier circuit 100 shown in FIG. 14 because relatively-large decoupling capacitance needs to be connected to stabilize the internal reference potential VREF6, the differential amplifier circuit 100 shown in FIG. 15 does not cause any delay even when large decoupling capacitance is connected.

Figure 16:
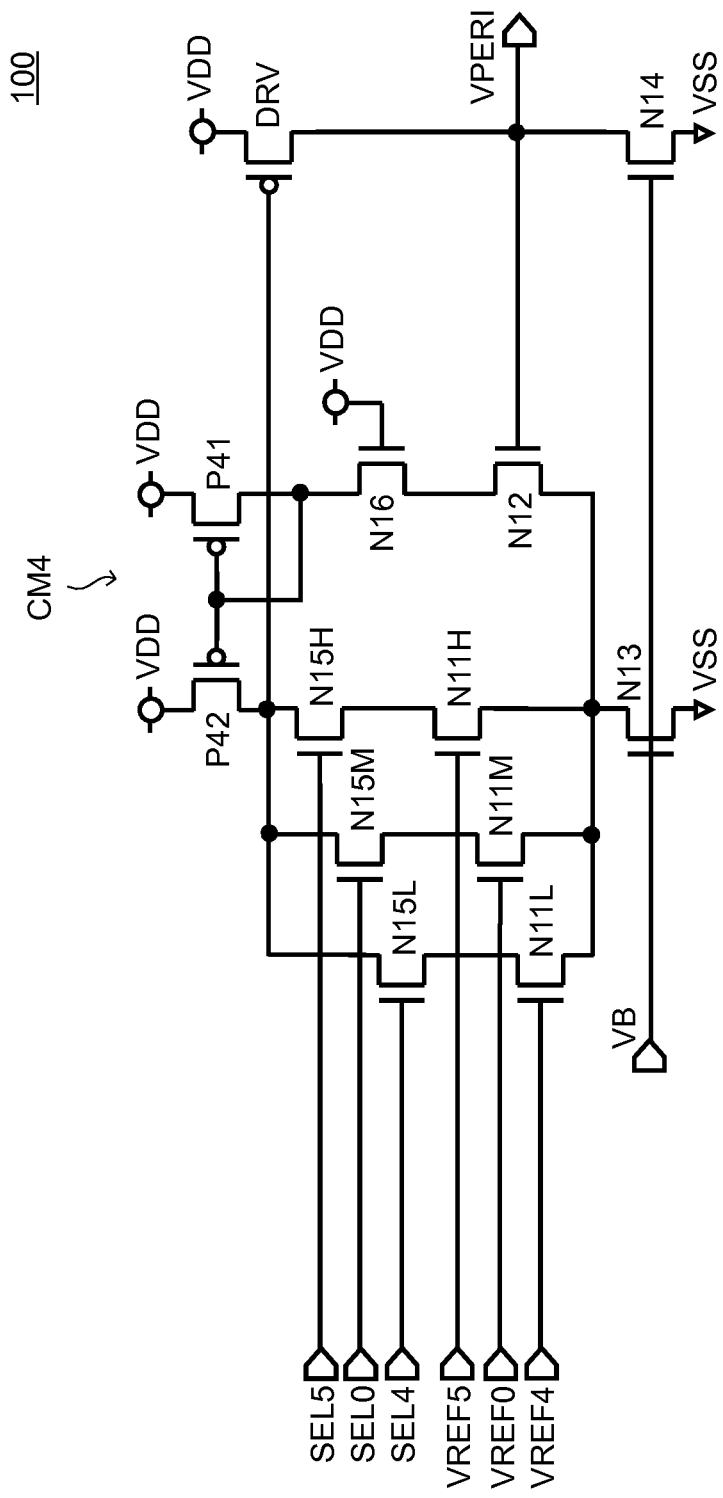
FIG. 16 is a circuit diagram of the differential amplifier circuit shown in FIG. 13 in a third example.

Turning to FIG. 16, the differential amplifier circuit 100 in the third example is different from the differential amplifier circuit 100 shown in FIG. 15 in that a current mirror circuit CM4 that includes transistors P41 and P42 is used instead of the current mirror circuits CM1 to CM3. The configuration of the other portions is the same as that of the differential amplifier circuit 100 shown in FIG. 15. Therefore, the same components are represented by the same reference symbols, and are not described again. In the differential amplifier circuit 100 shown in FIG. 16, the number of elements is much smaller. However, the differential amplifier circuit 100 shown in FIG. 16 can perform the same operation as the differential amplifier circuit 100 shown in FIG. 15 does. Moreover, another advantage is that, since the current mirror circuits CM1 to CM3 are not used, the differential amplifier circuit 100 shown in FIG. 16 consumes less current. However, compared with the differential amplifier circuit 100 shown in FIG. 15, the amplitude of a signal input to the gate electrode of the driver transistor DRV is restricted. Therefore, the current supply capability of the driver transistor DRV is slightly lower.

An information processing system including a semiconductor device of the present embodiment will be explained with reference to FIG. 17.

Figure 17:
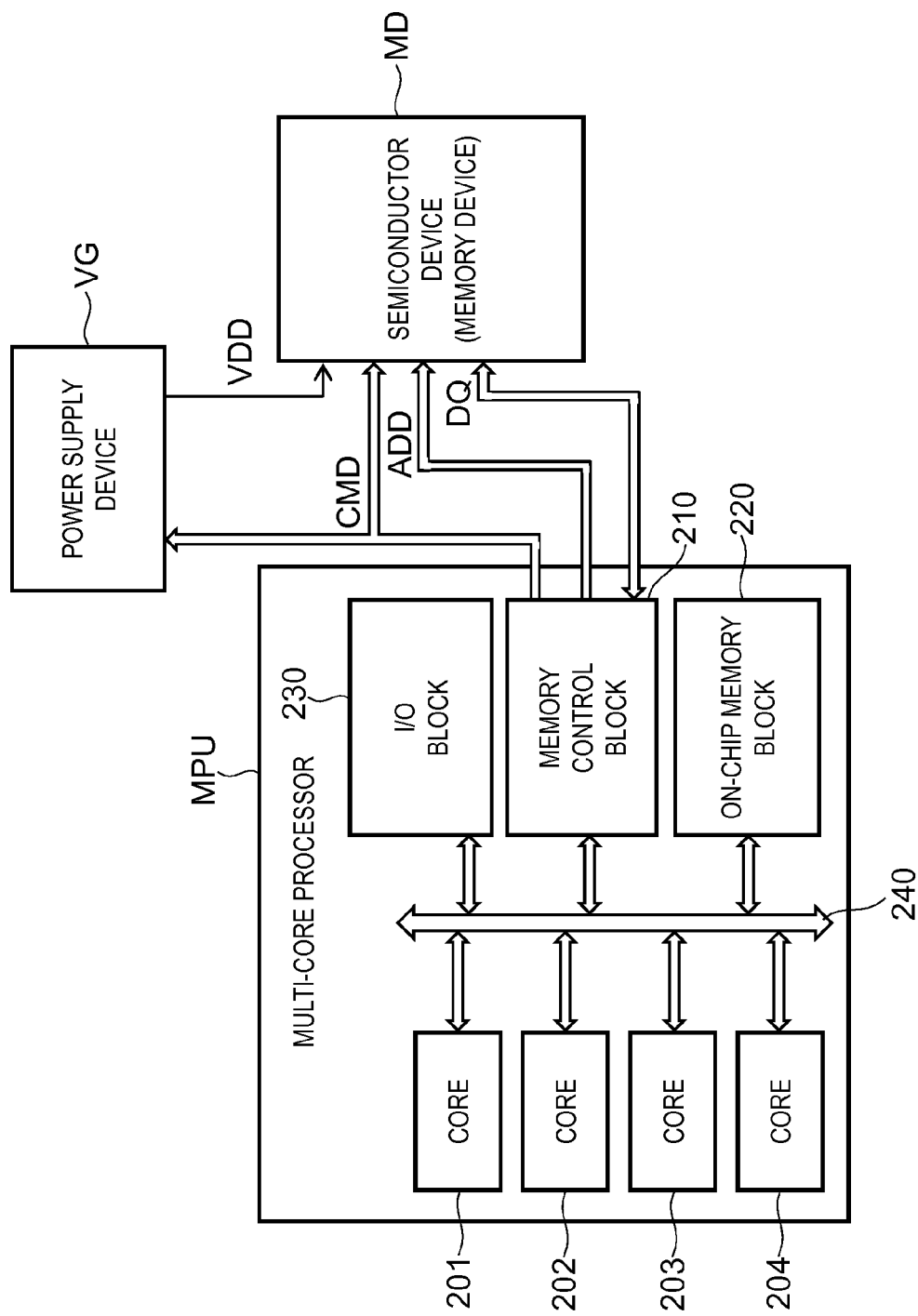
FIG. 17 is a block diagram showing the configuration of an information processing system including a semiconductor device of the present embodiment.

The information processing system shown in FIG. 17 includes a semiconductor device MD of the present embodiment, a multi-core processor MPU, and a power supply device VG. Both the multi-core processor MPU and the power supply device VG are connected to the semiconductor device MD. The multi-core processor MPU includes a plurality of cores 201 to 204 that can execute commands independently, a memory control block 210, an on-chip memory block 220, and an I/O block 230. The components are connected to each other through an internal bus 240. The memory control block 210 is a circuit block that controls the semiconductor device MD of the present embodiment. The memory control block 210 is designed to issue the address signal ADD and the command signal CMD, and process the read data DQ and the write data DQ. Therefore, the operation mode of the semiconductor device MD is set by the multi-core processor MPU.

Some of command signals CMD output from the multi-core processor MPU are supplied to the power supply device VG. The power supply device VG changes the voltage value of the external power-supply potential VDD supplied to the semiconductor device MD in accordance with the operation mode of the semiconductor device MD. Accordingly, the external power-supply potential VDD can be switched in accordance with the operation mode. That is, the operations described in FIGS. 7 and 8 can be realized.

The operation mode is preferably selected based on the number of cores activated. For example, when all the four cores 201 to 204 are activated, the high-speed operation mode is selected. When two or three of the cores 201 to 204 are activated, the standard mode is selected. When one of the cores 201 to 204 or no core is activated, the low power consumption mode is selected. In that manner, depending on the operation load on the multi-core processor MPU, the access speed of the semiconductor device MD, and the amount of current consumed can be adjusted.

Incidentally, a processor connected to the semiconductor device MD is not limited to the multi-core processor MPU. A single-core processor may be connected to the semiconductor device MD.

It is apparent that the present invention is not limited to the above embodiments, but may be modified and changed without departing from the scope and spirit of the invention.

For example, according to the above embodiment, there are three kinds of operation modes that are based on the DVFS function (standard mode, high-speed operation mode, and low power consumption mode). However, the number of operation modes is not limited to three. There may be two operation modes, or four or more operation modes. The operation mode may be changed linearly.

In addition, while not specifically claimed in the claim section, the applicant reserves the right to include in the claim section of the application at any appropriate time the following information processing systems:

A1. An information processing system comprising:
a semiconductor device; and
a processor that brings the semiconductor device into one of first and second modes,
wherein the semiconductor device comprising:
a memory cell array including a plurality of memory cells, the memory cell array operates on a first internal voltage;
a peripheral circuit accessing selected one or ones of the memory cells, the peripheral circuit operates on a second internal voltage;
a first internal voltage generation circuit that supplies the first internal voltage to the memory cell array; and
a second internal voltage generation circuit that supplies the second internal voltage to the peripheral circuit,
wherein the second internal voltage generation circuit sets the second internal voltage to a first voltage value in the first mode, and to a second voltage value that is different from the first voltage value in the second mode, and
wherein the first internal voltage generation circuit sets the first internal voltage to a third voltage value in both the first and second modes.

A2. The information processing system as described in A1, wherein the processor includes a plurality of cores that can execute commands independently, the processor brings the semiconductor device into one of the first and second modes based on number of cores activated.

What is claimed is:
1. A semiconductor device comprising:
a memory cell array including a plurality of memory cells, the memory cell array operates on a first internal voltage;
a peripheral circuit accessing selected one or ones of the memory cells, the peripheral circuit operates on a second internal voltage;
a first internal voltage generation circuit that supplies the first internal voltage to the memory cell array; and
a second internal voltage generation circuit that supplies the second internal voltage to the peripheral circuit,
wherein the second internal voltage generation circuit sets the second internal voltage to a first voltage value in a first mode, and to a second voltage value that is different from the first voltage value in a second mode, and
wherein the first internal voltage generation circuit sets the first internal voltage to a third voltage value in both the first and second modes.

2. The semiconductor device as claimed in claim 1, wherein the peripheral circuit operates in synchronism with a clock signal supplied from outside, and wherein the clock signal has a first frequency in the first mode and a second frequency that is different from the first frequency in the second mode.

3. The semiconductor device as claimed in claim 2, wherein the first voltage value is smaller than the second voltage value, and the first frequency is lower than the second frequency.

4. The semiconductor device as claimed in claim 3, wherein the number of cycles of the clock signal during a period from when a read command is supplied into the peripheral circuit until when read data that is read from the memory cell array is output to outside via the peripheral circuit, or the number of cycles of the clock signal during a period from when a write command is supplied into the peripheral circuit until when write data that is to be written into the memory cell array is supplied into the peripheral circuit from outside is a first cycle number in the first mode, and is a second cycle number that is different from the first cycle number in the second mode.

5. The semiconductor device as claimed in claim 4, wherein the first cycle number is smaller than the second cycle number.

6. The semiconductor device as claimed in claim 5, wherein a product of one cycle of the clock signal having the first frequency and the first cycle number is larger than a product of one cycle of the clock signal having the second frequency and the second cycle number.

7. The semiconductor device as claimed in claim 1, wherein each of the memory cells includes a cell transistor,
wherein the memory cell array further includes a plurality of word drivers each supplies one of a selection voltage and a non-selection voltage to control electrode of the cell transistor, and
wherein selected one or ones of word drivers set the selection voltage to the third voltage value in both the first and second modes.

8. The semiconductor device as claimed in claim 1, wherein the memory cell array further includes a sense amplifier that amplifies data read from the selected one or ones of the memory cells and supplies one of the first internal voltage and a third internal voltage having a fourth voltage value that is different from the third voltage value to the selected one or ones of the memory cells.

9. The semiconductor device as claimed in claim 8, wherein the fourth voltage value is at a ground level.

10. The semiconductor device as claimed in claim 1, wherein the second internal voltage generation circuit generates the second internal voltage based on an external voltage supplied from outside the device.

11. The semiconductor device as claimed in claim 1, wherein the second internal voltage has substantially the same voltage value as an external voltage supplied from outside the device.

12. The semiconductor device as claimed in claim 1, further comprising a mode register that indicates the first or second mode.

13. The semiconductor device as claimed in claim 1, further comprising a reference voltage generation circuit that generates a plurality of reference voltages including a first reference voltage having the first voltage value and a second reference voltage having the second voltage value,
wherein the second internal voltage generation circuit includes a differential amplifier circuit that generates the second internal voltage based on the plurality of reference voltages, and
wherein the differential amplifier circuit includes a plurality of first current paths each allow currents based on the plurality of reference voltages to flow therethrough, a second current path that allows a current based on the second internal voltage to flow therethrough, a common current path connected in common to the first and second current paths, and a switch that activates one of the plurality of first current paths.

14. A semiconductor device comprising:
a plurality of input terminals;
a command decoder coupled to ones of the input terminals and configured to generate a mode register set signal in response to signals supplied with the ones of the input terminals;
a mode register coupled to the command decoder, the mode register being configured to store mode data in response to the mode register set signal; and
an internal voltage generation circuit configured to generate an internal voltage and determine a level of the internal voltage in response to the mode data, wherein the internal voltage generation circuit is configured to generate an additional voltage and fix a level of the additional voltage regardless of the mode data.

15. The semiconductor device as claimed in claim 14, wherein the internal voltage generation circuit is configured to change the level of the internal voltage in response to a change of the mode data.

16. The semiconductor device as claimed in claim 14, wherein the internal voltage generation circuit is configured to change the level of the internal voltage from a first level to a second level different from the first level when a value of the mode data is changed from a first value to a second value different from the first value in response to the mode register set signal.

17. The semiconductor device as claimed in claim 14, further comprising a clock input terminal supplied with a clock signal and the mode data is controlled to be changed in response to a change in frequency of the clock signal.

18. The semiconductor device as claimed in claim 15, wherein the internal voltage generation circuit includes:
a reference voltage generating circuit configured to generate a plurality of reference voltages;
a selection circuit supplied with the reference voltages, the selection circuit being configured to select one of the reference voltages in response to the mode data; and
a drive circuit configured to generate the internal voltage in response to the one of the reference voltage.

19. A semiconductor device comprising:
a plurality of input terminals;
a command decoder coupled to ones of the input terminals and configured to generate a mode register set signal in response to signals supplied with the ones of the input terminals;
a mode register coupled to the command decoder, the mode register being configured to store mode data in response to the mode register set signal; and
an internal voltage generation circuit configured to generate an internal voltage and determine a level of the internal voltage in response to the mode data, wherein the internal voltage generation circuit includes:
a reference voltage generating circuit configured to generate a plurality of reference voltages;
a selection circuit supplied with the reference voltages, the selection circuit being configured to select one of the reference voltages in response to the mode data; and
a drive circuit configured to generate the internal voltage in response to the one of the reference voltage.

* * * * *